United States Patent
Sugita et al.

(10) Patent No.: US 10,837,810 B2
(45) Date of Patent: Nov. 17, 2020

(54) METHOD FOR CALIBRATING MEASURING DEVICE AND CASE USED IN THE CALIBRATION METHOD

(71) Applicant: TOKYO ELECTRON LIMITED, Tokyo (JP)

(72) Inventors: Kippei Sugita, Miyagi (JP); Tomohide Minami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 68 days.

(21) Appl. No.: 16/045,910

(22) Filed: Jul. 26, 2018

(65) Prior Publication Data

US 2019/0033103 A1    Jan. 31, 2019

(30) Foreign Application Priority Data

Jul. 31, 2017   (JP) .................. 2017-148031

(51) Int. Cl.

| | |
|---|---|
| *G01D 18/00* | (2006.01) |
| *H01L 21/67* | (2006.01) |
| *H01L 21/683* | (2006.01) |
| *H01J 37/32* | (2006.01) |
| *G01D 5/244* | (2006.01) |

(Continued)

(52) U.S. Cl.
CPC ......... *G01D 18/00* (2013.01); *G01D 5/24452* (2013.01); *H01J 37/32183* (2013.01); *H01J 37/32715* (2013.01); *H01J 37/32935* (2013.01); *H01L 21/67069* (2013.01); *H01L 21/67259* (2013.01); *H01L 21/681* (2013.01); *H01L 21/6831* (2013.01); *H01L 21/6833* (2013.01); *G01D 5/24* (2013.01); *H01J 2237/002* (2013.01); *H01J 2237/24564* (2013.01); *H01L 21/67167* (2013.01)

(58) Field of Classification Search
USPC .......................................... 324/601, 660–663
See application file for complete search history.

(56) References Cited

U.S. PATENT DOCUMENTS

| | | | | |
|---|---|---|---|---|
| 5,432,457 | A | * 7/1995 | Mitzner | ................. G01R 27/02 324/519 |
| 2015/0001200 | A1 | * 1/2015 | Harper | ..................... H05B 1/02 219/209 |
| 2016/0363433 | A1 | 12/2016 | Sugita et al. | |

FOREIGN PATENT DOCUMENTS

| | | |
|---|---|---|
| CN | 101373728 A | 2/2009 |
| JP | 2017-3557 A | 1/2017 |

* cited by examiner

*Primary Examiner* — Vincent Q Nguyen
(74) *Attorney, Agent, or Firm* — Rothwell, Figg, Ernst & Manbeck, P.C.

(57) ABSTRACT

In a method for calibrating a measuring device by using a case which includes a case main body configured to accommodate the measuring device, a restricting portion configured to restrict translation of the measuring device accommodated in the case main body and reference surfaces provided in the case main body to face the respective sensor electrodes, a plurality of detection values is acquired in a state where translation of the measuring device accommodated in the case is restricted by the restricting portion, the reference surfaces face respective sensor electrodes of the measuring device and a high frequency signal is applied to the sensor electrodes. Then, coefficients in functions used in calculating measurement values are calibrated such that the measurement values become a predetermined value.

9 Claims, 16 Drawing Sheets

(51) Int. Cl.
*H01L 21/68* (2006.01)
*G01D 5/24* (2006.01)

METHOD FOR CALIBRATING MEASURING DEVICE AND CASE USED IN THE CALIBRATION METHOD

CROSS-REFERENCE TO RELATED APPLICATIONS

This application claims priority to Japanese Patent Application No. 2017-148031 filed on Jul. 31, 2017, the entire contents of which are incorporated herein by reference.

FIELD OF THE INVENTION

The present disclosure relates to a method for calibrating a measuring device and a case used in the calibration method.

BACKGROUND OF THE INVENTION

In manufacturing electronic devices such as semiconductor devices, a processing system for processing a disk-shaped target object is used. The processing system includes a transfer unit for transferring the target object and a processing unit for processing the target object. Generally, the processing unit has a chamber body and a mounting table provided in the chamber body. The mounting table is configured to support the target object mounted thereon. The transfer unit is configured to transfer the target object onto the mounting table.

When the target object is processed by the processing unit, a position of the target object on the mounting table is important. Therefore, when the position of the target object on the mounting table is deviated from a predetermined position, it is required to adjust the transfer unit.

As for a technique for adjusting the transfer unit, there is known a technique described in Japanese Patent Application Publication No. 2017-3557. In the technique described in Japanese Patent Application Publication No. 2017-3557, a measuring device formed in the same disk shape as that of the target object and having an electrode for capacitance measurement is used. In the technique described in Japanese Patent Application Publication No. 2017-3557, the measuring device is transferred onto the mounting table by the transfer unit. The electrostatic capacitance that is dependent on the position of the electrode on the mounting table is measured and the transfer unit is adjusted to correct the transfer position of the target object based on the measurement value.

The measuring device for measuring an electrostatic capacitance requires a high-accuracy measurement performance. In order to realize the high-accuracy measurement performance, the measuring device needs to be calibrated. Further, it is required to simply calibrate the measuring device.

SUMMARY OF THE INVENTION

In accordance with an aspect, there is provided a method for calibrating a measuring device by using a case. The measuring device includes a disk-shaped base substrate, a plurality of sensor electrodes, a high frequency oscillator and an operation unit. The plurality of sensor electrodes is provided on the base substrate. The high frequency oscillator is configured to apply a high frequency signal to the plurality of sensor electrodes. The operation unit is configured to calculate a plurality of measurement values indicating electrostatic capacitances of the plurality of sensor electrodes by using a plurality of functions from a plurality of detection values corresponding to potentials of the plurality of sensor electrodes. The case includes a case main body, a restricting portion and a plurality of first reference surfaces. The case main body is configured to accommodate the measuring device. The restricting portion is configured to restrict translation of the measuring device accommodated in the case main body. the plurality of first reference surfaces is provided in the case main body to face the respective sensor electrodes. The calibration method includes: acquiring a plurality of first detection values, which is the plurality of detection values, in a state where translation of the measuring device is restricted by the restricting portion, the plurality of first reference surfaces face the respective sensor electrodes and the high frequency signal is applied to the plurality of sensor electrodes; and calibrating coefficients in the plurality of functions such that a plurality of first measurement values which is the plurality of measurement values calculated from the plurality of detection values becomes a first predetermined value.

In accordance with another aspect, there is provided a case used for calibrating a substantially disk-shaped measuring device which includes a plurality of sensor electrodes and is configured to acquire a plurality of measurement values indicating electrostatic capacitances of the plurality of sensor electrodes. The case includes a case main body, a restricting portion and a plurality of first reference surfaces. The case main body is configured to accommodate the measuring device. The restricting portion is configured to restrict translation of the measuring device accommodated in the case main body. The plurality of first reference surfaces is provided in the case main body to face the plurality of sensor electrodes.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
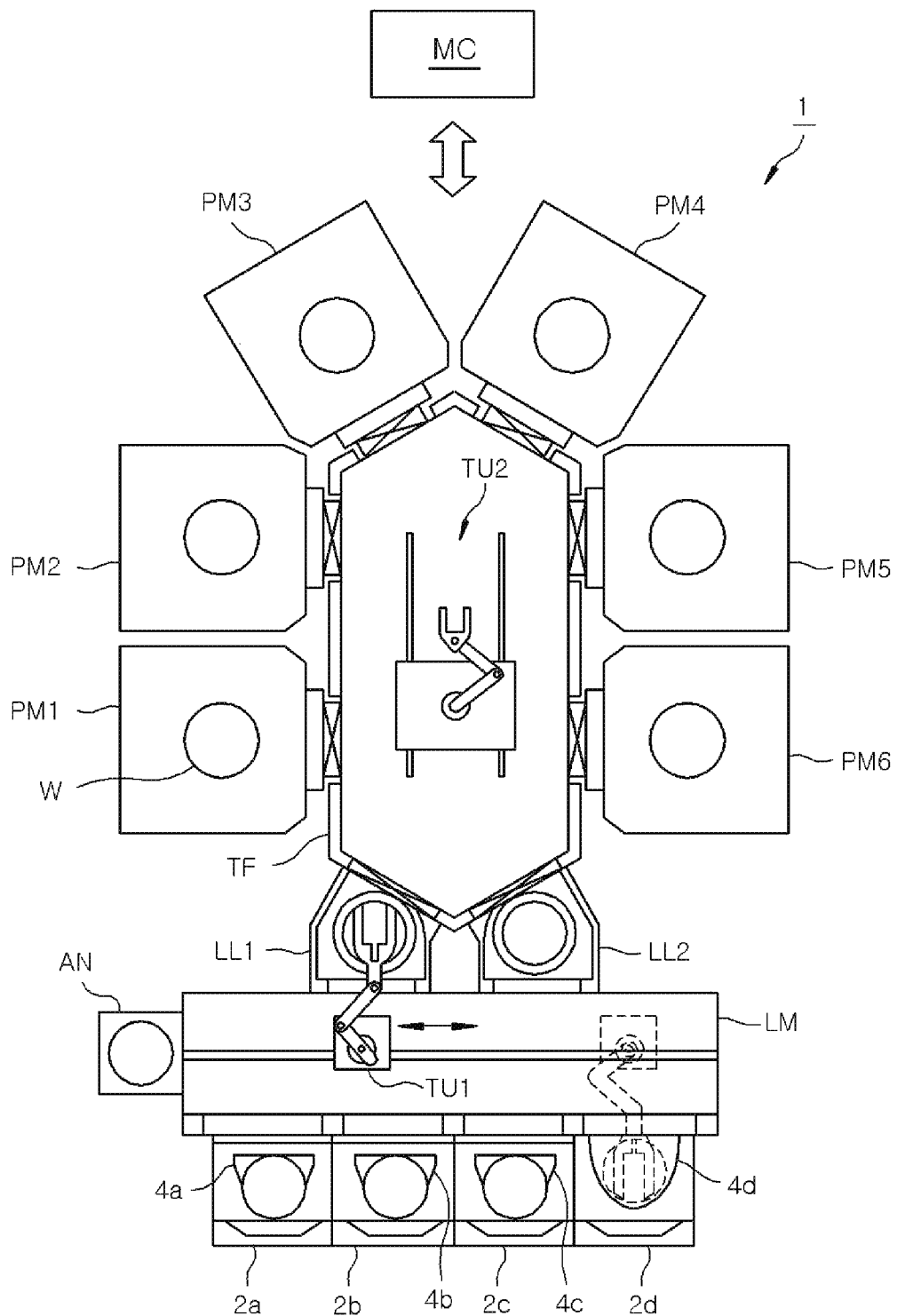
FIG. 1 shows an example of a processing system.

Hereinafter, various embodiments will be described in detail with reference to the accompanying drawings. Like reference numerals will be given to like or corresponding parts throughout the drawings First, a processing system including a processing unit for processing a disk-shaped target object and a transfer unit for transferring the target object to the processing unit will be described. FIG. 1 shows an example of the processing system. The processing system 1 includes stages 2a to 2d, containers 4a to 4d, a loader module LM, an aligner AN, load-lock modules LL1 and LL2, process modules PM1 to PM6, a transfer module TF, and a control unit MC. The number of the stages 2a to 2d, the number of the containers 4a to 4d, the number of the load-lock modules LL1 and LL2, and the number of the process modules PM1 to PM6 are not limited and may be one or more.

The stages 2a to 2d are arranged along one side of the loader module LM. The containers 4a to 4d are mounted on the stages 2a to 2d, respectively. Each of the containers 4a to 4d is, e.g., a container referred to as FOUP (Front Opening Unified Pod). Each of the containers 4a to 4d is configured to accommodate target objects W. The target object W has a substantially disk shape similar to that of a wafer.

The loader module LM has a chamber wall defining an atmospheric transfer space therein. In this transfer space, a transfer unit TU1 is provided. The transfer unit TU1 is, e.g., a multi-joint robot, and is controlled by the control unit MC. The transfer unit TU1 transfers the target object W between the containers 4a to 4d and the aligner AN, between the aligner AN and the load-lock modules LL1 and LL2, and between the load-lock modules LL1 and LL2 and the containers 4a to 4d.

Figure 2:
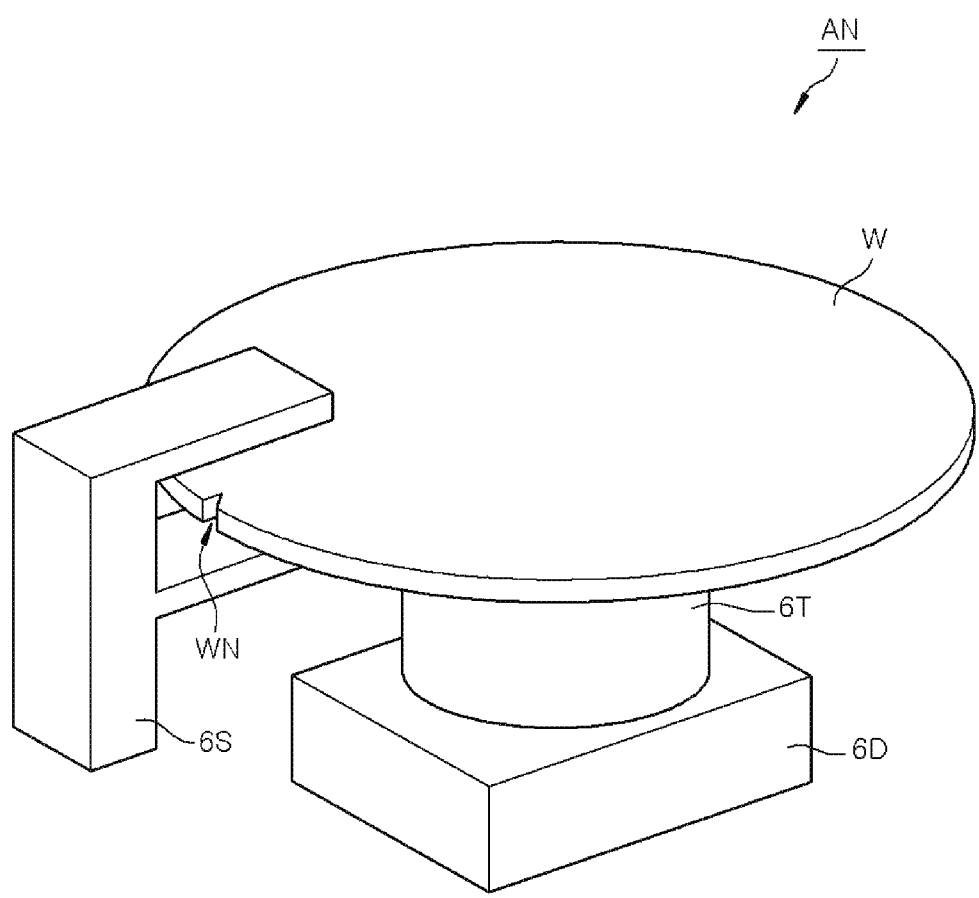
FIG. 2 is a perspective view showing an example of an aligner.

The aligner AN is connected to the loader module LM. The aligner AN is configured to adjust (calibrate) the position of the target object W. FIG. 2 is a perspective view showing an example of the aligner. The aligner AN includes a supporting table 6T, a driving unit 6D, and a sensor 6S. The supporting table 6T is a table that is rotatable about an axis extending in a vertical direction, and is configured to support the target object W thereon. The supporting table 6T is rotated by the driving unit 6D. The driving unit 6D is controlled by the control unit MC. When the supporting table 6T is rotated by power from the driving unit 6D, the target object W mounted on the supporting table 6T is also rotated.

The sensor 6S is an optical sensor, and detects an edge of the target object W during the rotation of the target object W. The sensor 6S detects the amount of deviation of an angular position of a notch WN (or another marker) of the target object W from a reference angular position and the amount of deviation of a central position of the target object W from the reference position based on the edge detection result. The sensor 6S outputs the amount of deviation of the angular position of the notch WN and the amount of deviation of the central position of the target object W to the control unit MC. The control unit MC calculates the amount of rotation of the supporting table 6T which will be used for correcting the angular position of the notch WN to the reference angular position based on the amount of deviation of the angular position of the notch WN. The control unit MC controls the driving unit 6D to rotate the supporting table 6T by the amount of rotation. Accordingly, the angular position of the notch WN can be corrected to the reference angular position. Further, the control unit MC controls a position of an end effector of the transfer unit TU1 at the time of receiving the target object W from the aligner AN based on the amount of deviation of the central position of the target object W such that the central position of the target object W coincides with a predetermined position on the end effector of the transfer unit TU1.

Returning to FIG. 1, each of the load-lock modules LL1 and LL2 is provided between the loader module LM and the transfer module TF. Each of the load-lock modules LL1 and LL2 provides a preliminary decompression chamber.

The transfer module TF is connected to the load-lock modules LL1 and LL2 through gate valves. The transfer module TF provides a depressurizable decompression chamber. In this decompression chamber, a transport unit TU2 is provided. The transfer unit TU2 is, e.g., a multi-joint robot, and is controlled by the control unit MC. The transfer unit TU2 is configured to transfer the target object W between the load-lock modules LL1 and LL2 and the process modules PM1 to PM6 and between any two process modules among the process modules PM1 to PM6.

The process modules PM1 to PM6 are connected to the transfer module TF through gate valves. Each of the process modules PM1 to PM6 is a processing unit configured to perform a dedicated process, such as plasma processing, on the target object W.

The following is description on a series of operations at the time of processing the target object W in the processing system 1. The target object W is unloaded from any one of the containers 4a to 4d and transferred to the aligner AN by the transfer unit TU1 of the loader module LM. Next, the transfer unit TU1 transfers the aligned target object W from the aligner AN to one of the load-lock modules LL1 and LL2. Then, a pressure in a preliminary decompression chamber of the load-lock module LL1 or LL2 is decreased to a predetermined level. Thereafter, the target object W is transferred from the load-lock module LL1 or LL2 to one of the process modules PM1 to PM6 by the transfer unit TU2 of the transfer module TF. The target object W is processed in one or more process modules among the process modules PM1 to PM6. Next, the processed target object W is transferred from the process module to one of the load-lock modules LL1 and LL2 by the transfer unit TU2. Then, the target object W is transferred from the load-lock module LL1 or LL2 to one of the containers 4a to 4d by the transfer unit TU1.

As described above, the processing system 1 includes the control unit MC. The control unit MC may be a computer including a processor, a storage unit such as a memory, a display unit, an input/output unit, a communication unit and the like. The above-described series of operations of the processing system 1 are realized by controlling the respective components of the processing system 1 by the control unit MC based on a program stored in the storage unit.

Figure 3:
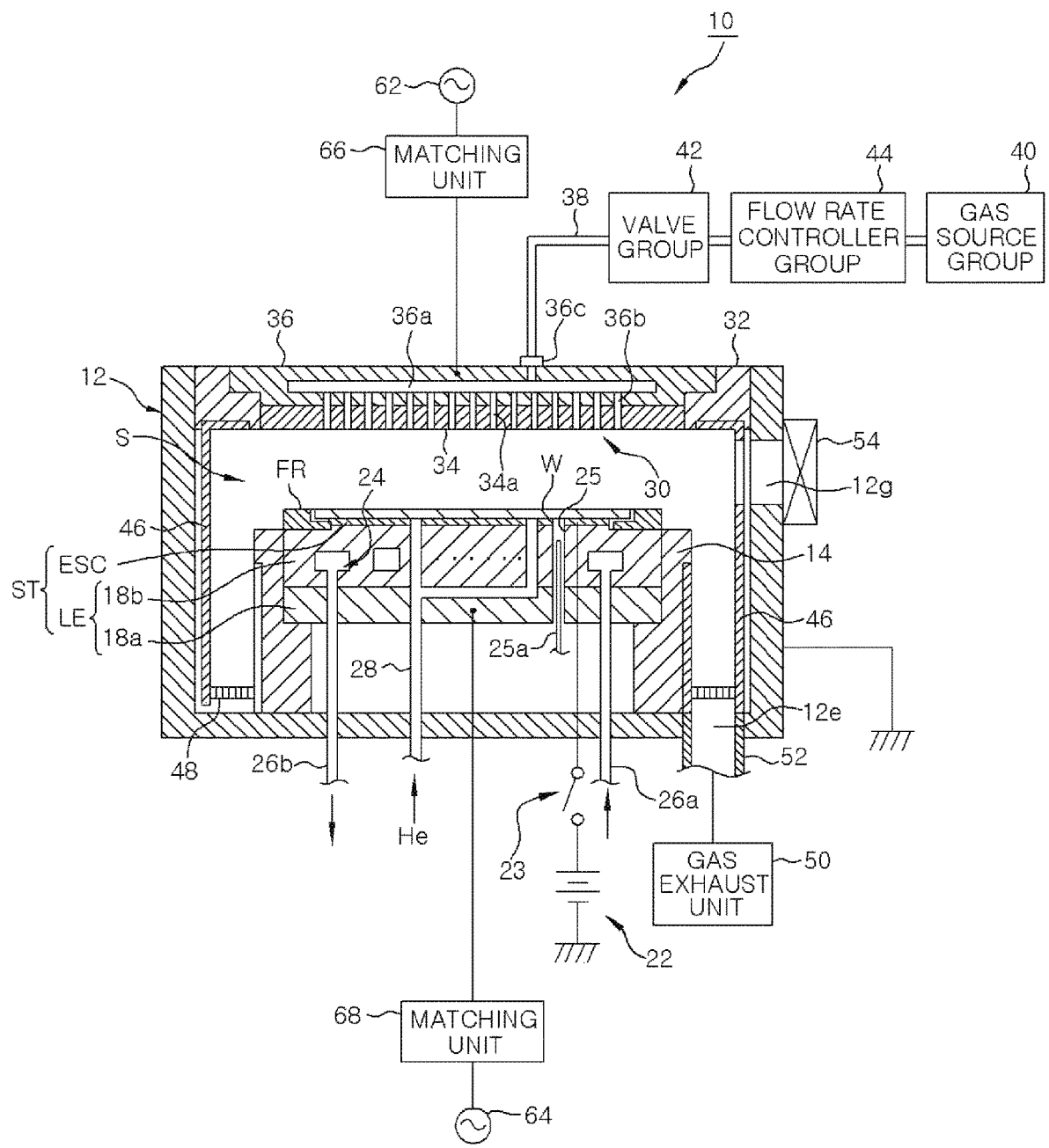
FIG. 3 shows an example of a plasma processing apparatus.

FIG. 3 shows an example of a plasma processing apparatus that may be employed as one of the process modules PM1 to PM6. A plasma processing apparatus 10 shown in FIG. 3 is a capacitively coupled plasma etching apparatus. The plasma processing apparatus 10 includes a substantially cylindrical chamber main body 12. The chamber main body 12 is made of, e.g., aluminum. Anodic oxidation treatment may be performed on an inner wall surface of the chamber main body 12. The chamber main body 12 is frame grounded.

A substantially cylindrical supporting member 14 is provided on a bottom portion of the chamber main body 12. The supporting member 14 is made of, e.g., an insulating material. The supporting member 14 is provided in the chamber main body 12 and extends upward from the bottom portion of the chamber main body 12. In a chamber S defined by the chamber main body 12, a stage ST is provided. The stage ST is supported by the supporting member 14.

The stage ST includes a lower electrode LE and an electrostatic chuck ESC. The lower electrode LE has a first plate 18a and a second plate 18b. The first plate 18a and the second plate 18b are made of a metal, e.g., aluminum, and has a substantially disk shape. The second plate 18b is provided on the first plate 18a. The second plate 18b is electrically connected to the first plate 18a.

The electrostatic chuck ESC is provided on the second plate 18b. The electrostatic chuck ESC has a structure in which an electrode that is a conductive film is interposed between two insulating layers or sheets. The electrostatic chuck ESC has a substantially disk shape. A DC power supply is electrically connected to the electrode of the electrostatic chuck ESC via a switch 23. The target object W is attracted and held on the electrostatic chuck ESC by electrostatic force such as Coulomb force or the like which is generated by a DC voltage from the DC power supply 22. Accordingly, the target object W can be held on the electrostatic chuck ESC.

A focus ring FR is provided on a peripheral portion of the second plate 18b. The focus ring FR surrounds an edge of the target object W and the electrostatic chuck ESC. The focus ring FR has a first portion P1 and a second portion P2 (see FIG. 7). The first portion P1 and the second portion P2 have an annular plate shape. The second portion P2 is disposed on the first portion P1. A diameter of an inner periphery P2i of the second portion P2 is greater than a diameter of an inner periphery Phi of the first portion P1. The target object W is mounted on the electrostatic chuck ESC such that the edge region thereof is positioned above the first portion P1 of the focus ring FR. The focus ring FR may be made of a material selected among silicon, silicon carbide, silicon oxide and the like.

A coolant channel 24 is provided in the second plate 18b. The coolant channel 24 constitutes a temperature control mechanism. A coolant is supplied from a chiller unit (not shown) provided at the outside of the chamber main body 12 into the coolant channel 24 through a line 26a. The coolant supplied into the coolant channel 24 is returned to the chiller unit through a line 26b. The coolant circulates between the coolant channel 24 and the chiller unit. By controlling a temperature of the coolant, a temperature of the target object W held on the electrostatic chuck ESC is controlled.

A plurality of (e.g., three) through-holes 25 is formed through the stage ST. A plurality of (e.g., three) lift pins 25a is inserted into the plurality of through-holes 25, respectively. FIG. 3 shows one through-hole 25 into which one lift pin 25a is inserted.

The plasma processing apparatus 10 is provided with a gas supply line 28. The gas supply line 28 supplies a heat transfer gas, e.g., He gas, from a heat transfer gas supply unit (not shown) to a gap between a top surface of the electrostatic chuck ESC and a backside of the target object W.

The plasma processing apparatus 10 includes an upper electrode 30. The upper electrode 30 is provided above the stage ST to face the stage ST. The upper electrode 30 is supported at an upper portion of the chamber main body 12 through an insulating shield member 32. The upper electrode 30 may include a top plate 34 and a holding body 36. The top plate 34 faces the chamber S and a plurality of gas injection holes 34a is formed in the top plate 34. The top plate 34 may be made of silicon or quartz. Alternatively, the top plate 34 may be formed by forming a plasma-resistant film such as an yttrium oxide film on a surface of an aluminum base material.

The holding body 36 detachably holds the top plate 34 and may be made of a conductive material, e.g., aluminum. The holding body 36 may have a water-cooling structure. A gas diffusion space 36a is provided in the holding body 36. A plurality of gas holes 36b communicating with the gas injection holes 34a extends downward from the gas diffusion space 36a. A gas inlet port 36c for introducing a processing gas into the gas diffusion space 36a is formed at the holding body 36. A gas supply line 38 is connected to the gas inlet port 36c.

A gas source group 40 is connected to the gas supply line 38 through a valve group 42 and a flow rate controller group 44. The gas source group 40 includes a plurality of gas sources for a plurality of gases. The valve group 42 includes a plurality of valves. The flow rate controller group 44 includes a plurality of flow rate controllers such as mass flow controllers. A plurality of gas sources of the gas source group 40 is connected to the gas supply line 38 via corresponding valves of the valve group 42 and corresponding flow rate controllers of the flow rate controller group 44, respectively.

In the plasma processing apparatus 10, a deposition shield 46 is detachably provided along an inner surface of an sidewall of the chamber main body 12. The deposition shield 46 is also provided at an outer periphery of the supporting member 14. The deposition shield 46 prevents etching by-products (deposits) from being adhered to the chamber main body 12. The deposition shield 46 may be formed by coating ceramic such as $Y_2O_3$ or the like on an aluminum base material.

At a lower portion in the chamber main body 12, a gas exhaust plate 48 is provided between the supporting member 14 and the sidewall of the chamber main body 12. The gas exhaust plate 48 may be formed by coating ceramic such as $Y_2O_3$ or the like on an aluminum base material, for example. A plurality of holes is formed in the gas exhaust plate 48 to penetrate therethrough in a thickness direction thereof. A gas exhaust port 12e is provided at the chamber main body 12 to be positioned below the gas exhaust plate 48. A gas exhaust unit 50 is connected to the gas exhaust port 12e through a gas exhaust line 52. The gas exhaust unit 50 includes a pressure control valve and a vacuum pump such as a turbo molecular pump or the like, and thus can decrease a pressure in a space in the chamber main body 12 to a desired vacuum level. A loading/unloading port 12g for the target object W is provided at the sidewall of the chamber main body 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 MHz to 100 MHz, for plasma generation. The first high frequency power supply 62 is connected to the upper electrode 30 via a matching unit 66. The matching unit 66 includes a circuit for matching an output impedance of the first high frequency power supply 62 and an input impedance of a load side (the upper electrode 30 side). The first high frequency power supply 62 may be connected to the lower electrode LE via the matching unit 66.

The second high frequency power supply 64 generates a second high frequency power, which has a high frequency of, e.g., 400 kHz to 13.56 MHz, for attracting ions to the target object W. The second high frequency power supply 64 is connected to the lower electrode LE via a matching unit 68. The matching unit 68 includes a circuit for matching an output impedance of the second high frequency power supply and an input impedance of a load side (the lower electrode LE side).

In the plasma processing apparatus 10, a gas from one or more gas sources selected among the gas sources is supplied into the chamber S. A pressure in the chamber S is set to a predetermined pressure by the gas exhaust unit 50. The gas in the chamber S is excited by the first high frequency power from the first high frequency power supply 62 to generate plasma. The target object W is processed by active species. If necessary, ions may be attracted to the target object W by the second high frequency power for bias of the second high frequency power supply 64.

Figure 4:
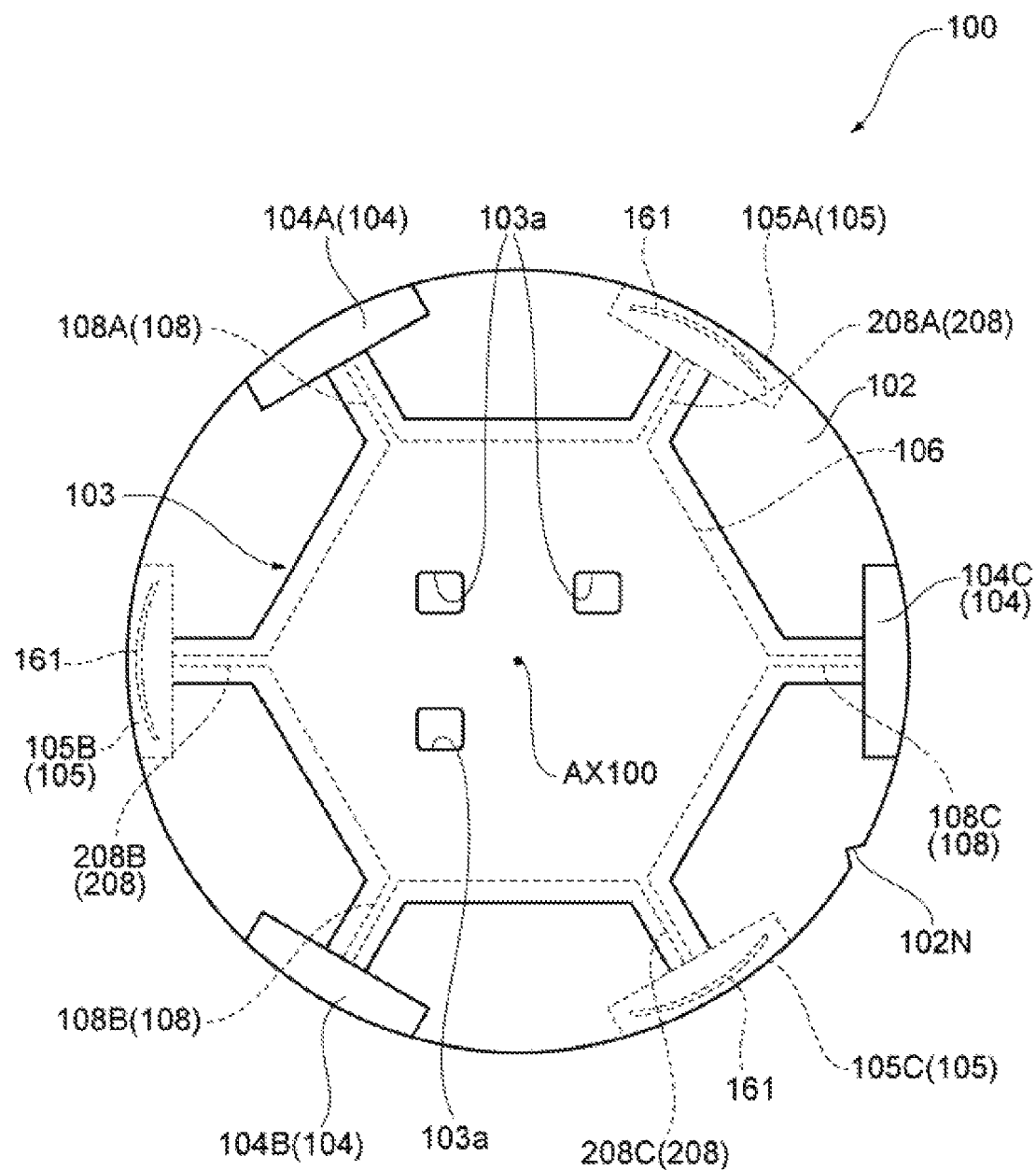
FIG. 4 is a top view of a measuring device viewed from the top.
Figure 5:
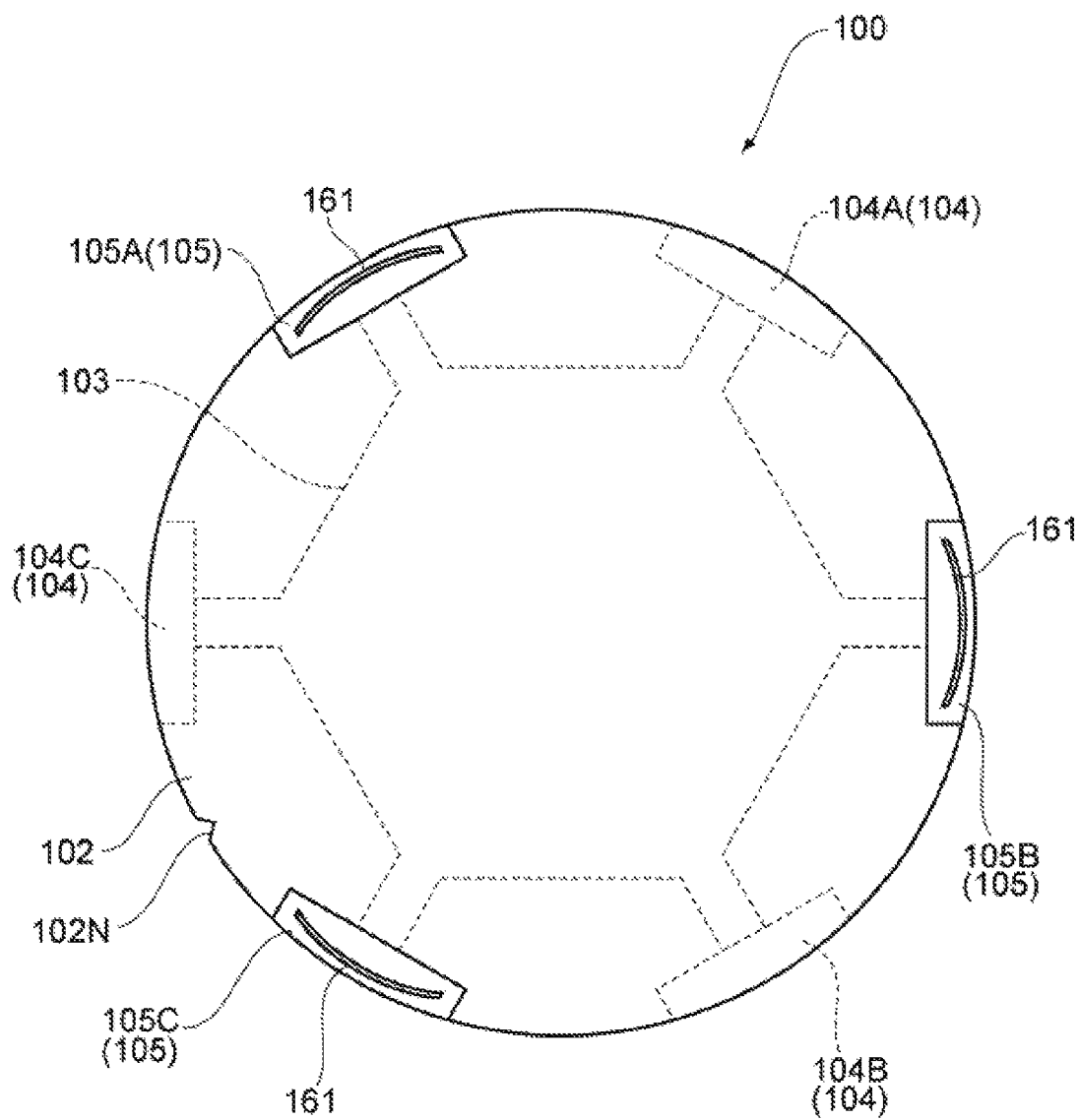
FIG. 5 is a bottom view of the measuring device viewed from the bottom.

Hereinafter, the measuring device will be described. FIG. 4 is a top view of the measuring device viewed from the top. FIG. 5 is a bottom view of the measuring device viewed from the bottom. A measuring device 100 shown in FIGS. 4 and 5 includes a base substrate 102. The base substrate 102 is made of, e.g., silicon, and formed in the same shape as that of the target object W, i.e., a substantially disc shape. A diameter of the base substrate 102 is the same as that of the target object W, e.g., 300 mm. The shape and the size of the measuring device 100 may be determined by the shape and the size of the base substrate 102. Therefore, the measuring device 100 has the same shape and the same size as those of the target object W. A notch 102N (or another marker) is formed at an edge of the base substrate 102.

The base substrate 102 is provided with a plurality of first sensors 104A to 104C for electrostatic capacitance measurement. The number of the first sensors provided at the measuring device 100 may be three or more. The first sensors 104A to 104C are arranged at a regular interval along the edge of the base substrate 102 in the entire circumference of the edge. Specifically, each of the first sensors 104A to 104C is provided along the edge of the upper surface of the base substrate. Front end surfaces 104f of the first sensors 104A to 104C are provided along the side surface of the base substrate 102.

In addition, the base substrate 102 is provided with a plurality of second sensors 105A to 105C for electrostatic capacitance measurement. The number of the second sensors provided at the measuring device 100 may be three or more. The second sensors 105A to 105C are arranged at a regular interval along the edge of the base substrate 102 in the entire circumference of the edge. Specifically, each of the second sensors 105A to 105C is provided along the edge of the bottom surface of the base substrate. Sensor electrodes 161 of the second sensors 105A to 105C are provided along the bottom surface of the base substrate 102. The second sensors 105A to 105C and the first sensors 104A to 104C are alternately arranged at an interval of 60° in the circumferential direction.

A circuit board 106 is provided at a central portion of the upper surface of the base substrate 102. Wiring groups 108A to 108C for electrically connecting the circuit board 106 and the first sensors 104A to 104C are provided therebetween. Wiring groups 208A to 208C for electrically connecting the circuit board 106 and the second sensors 105A to 105C are provided therebetween. The circuit board 106, the wiring groups 108A to 108C, and the wiring groups 208A to 208C are covered with a cover 103. The cover 103 is provided with a plurality of openings 103a. The positions of the openings 103a coincides with those of power supply connectors 177a, which will be described later, arranged on the circuit board 106 or the like.

Figure 6:
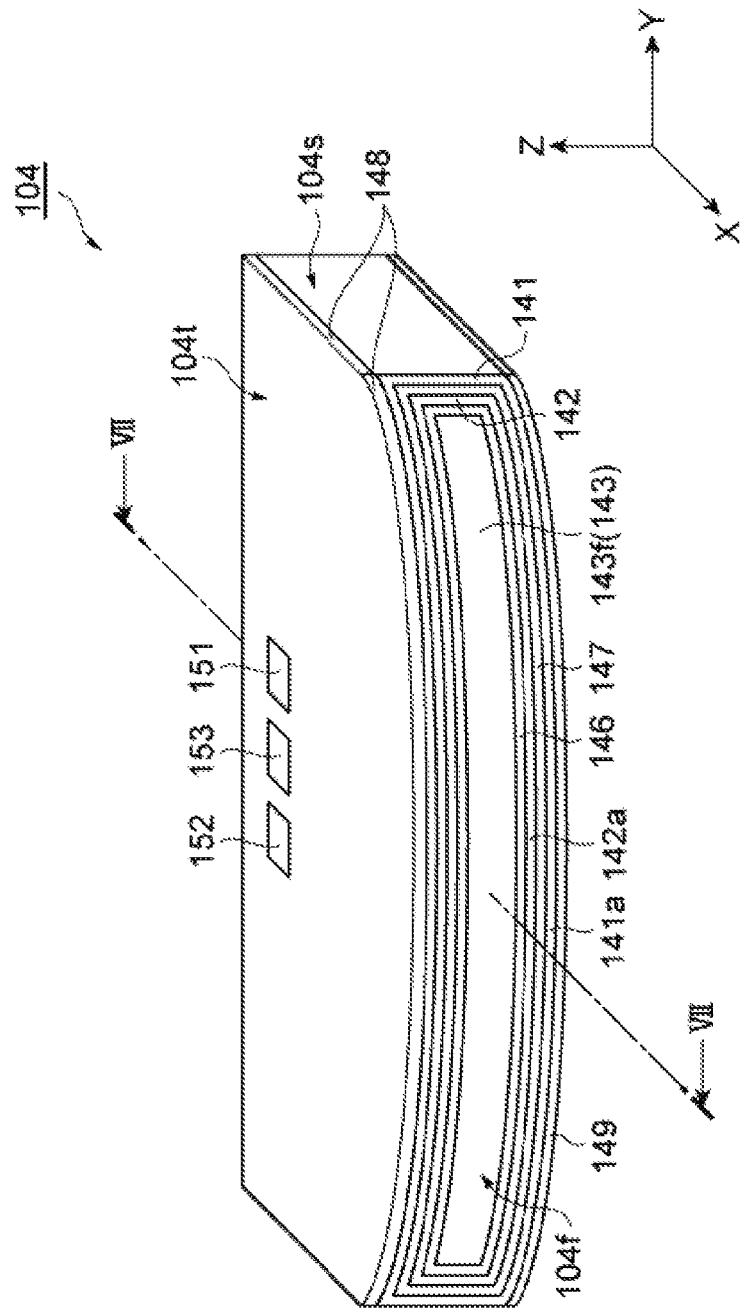
FIG. 6 is a perspective view showing an example of a first sensor.
Figure 7:
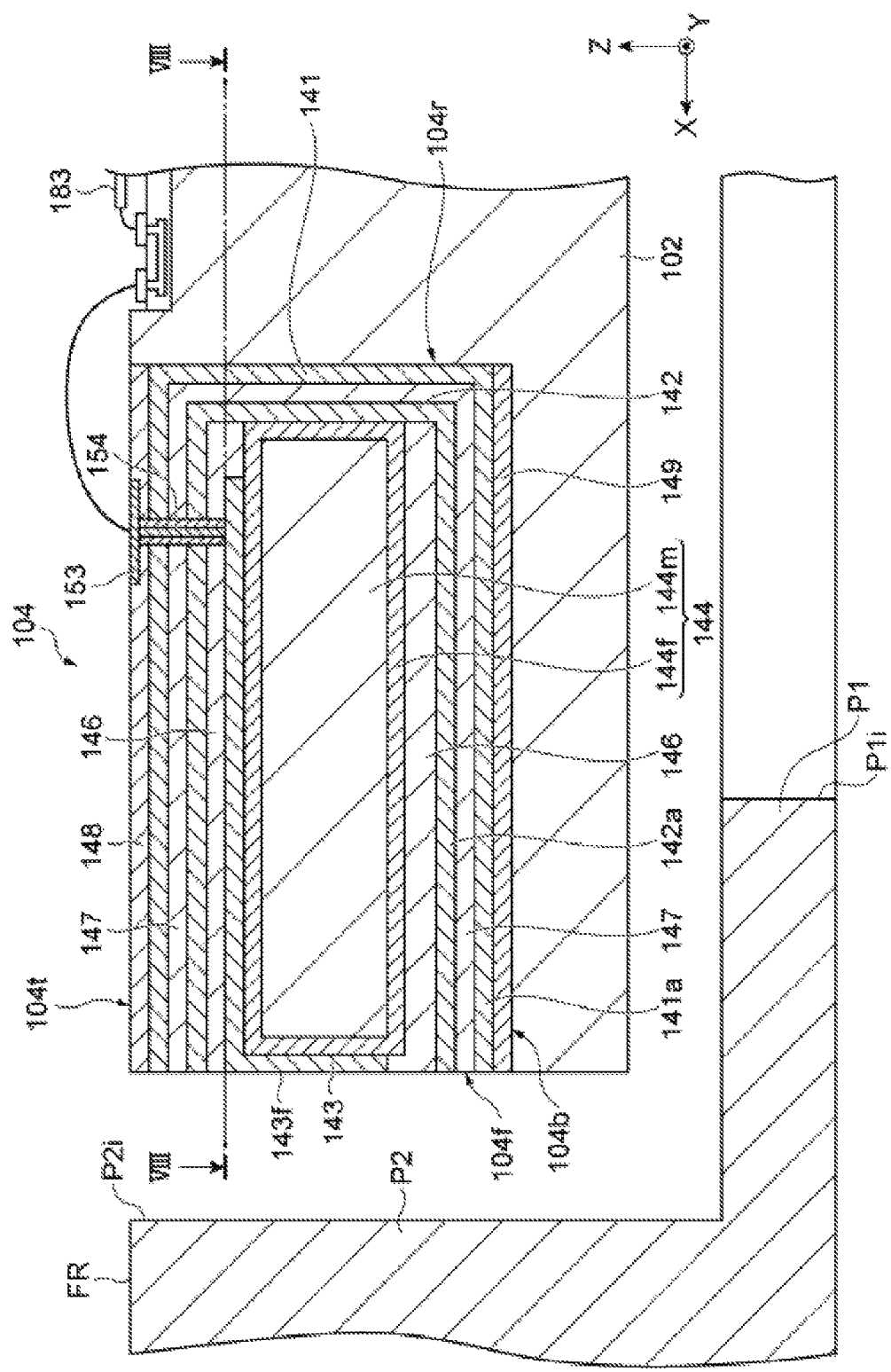
FIG. 7 is a cross sectional view taken along a line VII-VII of FIG. 6.
Figure 8:
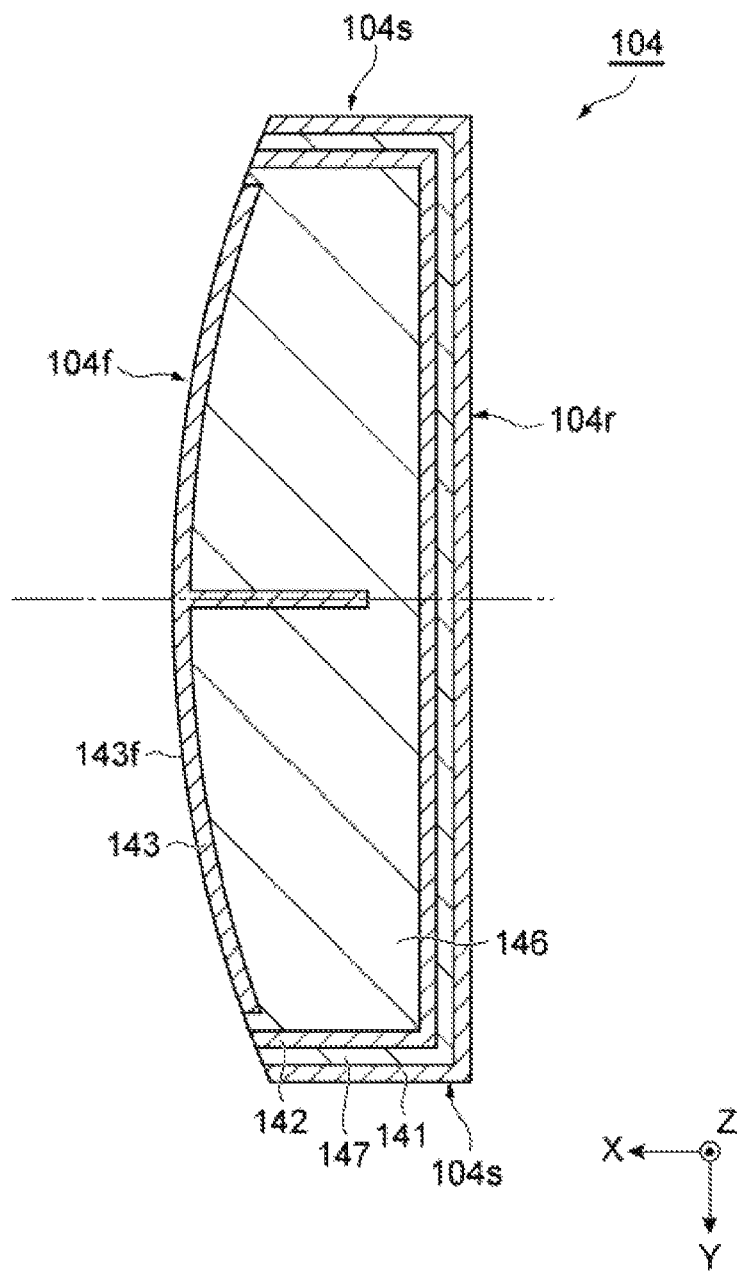
FIG. 8 is a cross sectional view taken along a line VIII-VIII of FIG. 7.

Hereinafter, the first sensor will be described in detail. FIG. 6 is a perspective view showing an example of a sensor. FIG. 7 is a cross sectional view taken along a line VII-VII of FIG. 6. FIG. 8 is a cross sectional view taken along a line VIII-VIII of FIG. 7. The first sensor 104 shown in FIGS. 6 to 8 is used as the first sensors 104A to 104C of the measuring device 100. In one example, the first sensor 104 is configured as a chip-shaped component. In the following description, the XYZ orthogonal coordinate system will be appropriately referred to. The X direction indicates a frontward direction of the first sensor 104. The Y direction indicates a width direction of the first sensor 104 which is orthogonal to the X direction. The Z direction indicates an upward direction of the first sensor 104 which is orthogonal to the X direction and the Y direction.

As shown in FIGS. 6 to 8, the first sensor 104 has a front end surface 104f, an upper surface 104t, a lower surface 104b, a pair of side surfaces 104s, and a rear end surface 104r. The front end surface 104f forms a front surface of the first sensor 104 in the X direction. The first sensor 104 is mounted on the base substrate 102 of the measuring device 100 such that the front end surface 104f is radially directed with respect to the central axis AX100 (see FIG. 4). In a state where the first sensor 104 is mounted on the base substrate 102, the front end surface 104f extends along the edge of the base substrate 102. Therefore, when the measuring device 100 is disposed on the electrostatic chuck ESC, the front end surface 104f faces an inner periphery of the focus ring FR.

The rear end surface 104r forms a rear surface of the first sensor 104 in the X direction. In a state where the first sensor 104 is mounted on the base substrate 102, the rear end surface 104r is positioned closer to the central axis AX100, compared to the front end surface 104f. The upper surface 104t forms a top surface of the first sensor 104 in the Z direction, and the lower surface 104b forms a bottom surface of the first sensor 104 in the Z direction. The pair of side surfaces 104s forms the surfaces of the first sensor 104 in the Y direction.

The first sensor 104 includes a sensor electrode 143. The first sensor 104 may further include an electrode 141 and a guard electrode 142. The electrode 141 is made of a conductor. The electrode 141 has a first portion 141a. As shown in FIGS. 6 and 7, the first portion 141a extends in the X direction and the Y direction.

The guard electrode 142 is made of a conductor. The guard electrode 142 has a second portion 142a. The second portion 142a extends above the first portion 141a. In the first sensor 104, the guard electrode 142 is insulated from the electrode 141. As shown in FIGS. 6 and 7, the second portion 142a extends in the X direction and the Y direction above the first portion 141a.

The sensor electrode 143 is made of a conductor. The sensor electrode 143 is provided above the first portion 141a of the electrode 141 and the second portion 142a of the guard electrode 142. The sensor electrode 143 is insulated from the electrode 141 and the guard electrode 142 in the first sensor 104. The sensor electrode 143 has a front surface 143f. The front surface 143f extends in a direction intersecting with the first portion 141a and the second portion 142a. Further, the front surface 143f extends along the front end surface 104f of the first sensor 104. In one embodiment, the front surface 143f forms a part of the front end surface 104f of the first sensor 104. Alternatively, the first sensor 104 may have an insulating film covering the front surface 143*f* in front of the front surface 143*f* of the sensor electrode 143.

As shown in FIGS. 6 to 8, the electrode 141 and the guard electrode 142 may open toward a region (X direction) where the front surface 143*f* of the sensor electrode 143 is disposed and extend to surround the sensor electrode 143. In other words, the electrode 141 and the guard electrode 142 may extend to surround the sensor electrode 143 from all sides except the front side of the sensor electrode 143.

Further, the front end surface 104*f* of the first sensor 104 may be a curved surface having a predetermined curvature. In that case, the front end surface 104*f* has a constant curvature at any position thereof, and the curvature of the front end surface 104*f* may be a reciprocal of a distance between the central axis AX100 of the measuring device 100 and the front end surface 104*f*. The first sensor 104 is mounted on the base substrate 102 such that the center of curvature of the front end surface 104*f* coincides with the central axis AX100.

The first sensor 104 may further include a substrate member 144, insulating regions 146 to 148, pads 151 to 153, and a via wiring 154. The substrate member 144 has a main body portion 144*m* and a surface layer portion 144*f*. The main body portion 144*m* is made of, e.g., silicon. The surface layer portion 144*f* covers the surface of the main body portion 144*m*. The surface layer portion 144*f* is made of an insulating material. The surface layer portion 144*f* is, e.g., a thermal oxide film of silicon.

The second portion 142*a* of the guard electrode 142 extends below the substrate member 144. The insulating region 146 is provided between the substrate member 144 and the guard electrode 142. The insulating region 146 is made of, e.g., SiO₂, SiN, Al₂O₃, or polyimide.

The first portion 141*a* of the electrode 141 extends below the substrate member 144 and the second portion 142*a* of the guard electrode 142. The insulating region 147 is provided between the electrode 141 and the guard electrode 142. The insulating region 147 is made of, e.g., SiO₂, SiN, Al₂O₃, or polyimide.

The insulating region 148 forms the upper surface 104*t* of the first sensor 104. The insulating region 148 is made of, e.g., SiO₂, SiN, Al₂O₃, or polyimide. The pads 151 to 153 are formed in the insulating region 148. The pad 153 is made of a conductor and connected to the sensor electrode 143. Specifically, the sensor electrode 143 and the pad 153 are connected to each other by the via wiring 154 extending through the insulating region 146, the guard electrode 142, the insulating region 147, and the electrode 141. An insulator is provided around the via wiring 154 and the via wiring 154 is insulated from the electrode 141 and the guard electrode 142. The pad 153 is connected to the circuit board 106 through a wiring 183 provided in the base substrate 102. The pads 151 and 152 are also made of a conductor. The pads 151 and 152 are connected to the electrode 141 and the guard electrode 142 through corresponding via wirings, respectively. Further, the pads 151 and 152 are connected to the circuit board 106 through corresponding wirings provided on the base substrate 102.

Figure 9:
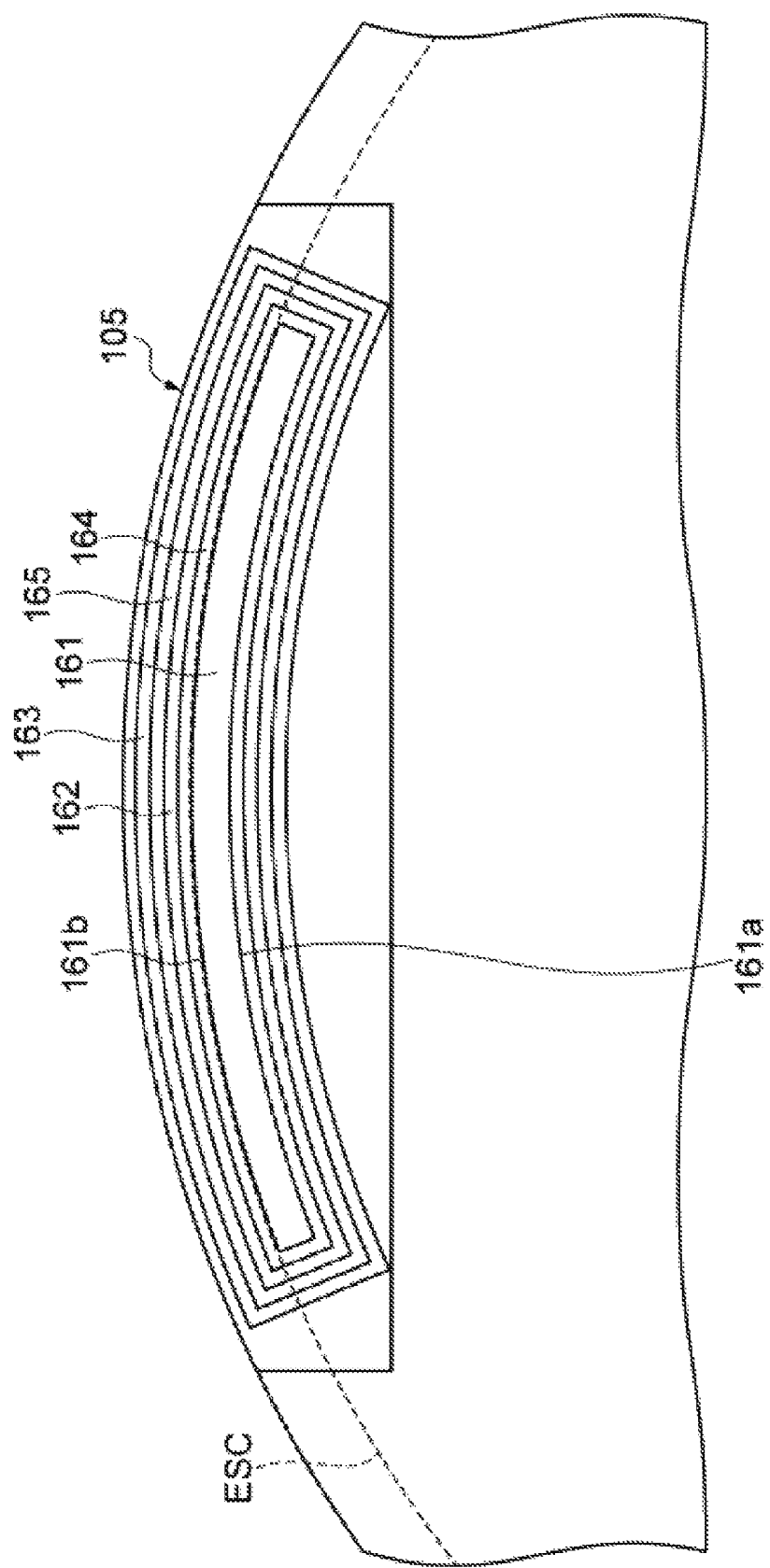
FIG. 9 is an enlarged view of a second sensor shown in FIG. 5.

Hereinafter, the second sensor will be described in detail. FIG. 9 is a partially enlarged view of FIG. 5 and shows a single second sensor. The edge of the sensor electrode 161 has partially a circular arc shape. In other words, the sensor electrode 161 has a planar shape defined by two circular arcs 161*a* and 161*b* having different radii about the central axis AX100. The radially outer arcs 161*b* of the sensor electrodes 161 of the second sensors 105A to 105C extend on a common circle. The radially inner arcs 161*a* of the sensor electrodes 161 of the second sensors 105A to 105C extend on another common circle. A curvature of a part of the edge of the sensor electrode 161 coincides with the curvature of the edge of the electrostatic chuck ESC. In one embodiment, the curvature of the arc 161*b* forming the radial outer edge of the sensor electrode 161 coincides the curvature of the edge of the electrostatic chuck ESC. The center of curvature of the arc 161*b*, i.e., the center of the circle on which the arc 161*b* extends, shares the central axis AX100.

In one embodiment, each of the second sensors 105A to 105C further includes a guard electrode 162 surrounding the sensor electrode 161. The guard electrode 162 has a frame shape and surrounds the entire periphery of the sensor electrode 161. The guard electrode 162 and the sensor electrode 161 are separated from each other with an insulating region 164 interposed therebetween. Further, in one embodiment, each of the second sensors 105A to 105C further includes anguard electrode 163 surrounding the guard electrode 162. The electrode 163 has a frame shape and surrounds the entire periphery of the guard electrode 162. The guard electrode 162 and the electrode 163 are separated from each other with an insulating region 165 interposed therebetween.

Figure 10:
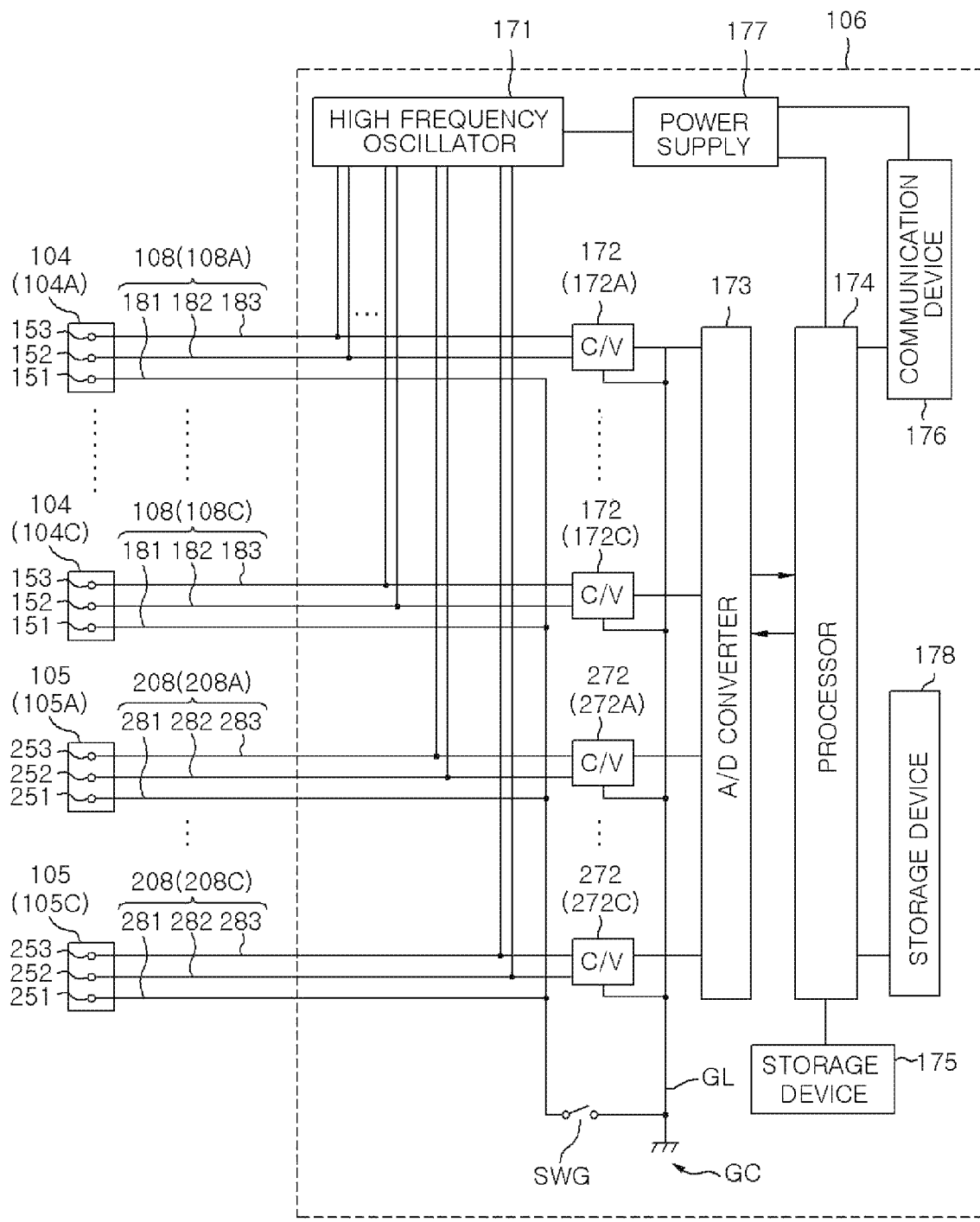
FIG. 10 shows an exemplary configuration of a circuit board of the measuring device.

Hereinafter, the configuration of the circuit board 106 will be described. FIG. 10 shows an exemplary configuration of the circuit board of the measuring device. As shown in FIG. 10, the circuit board 106 includes a high frequency oscillator 171, a plurality of C/V conversion circuits 172A to 172C, a plurality of C/V conversion circuits 272A to 272C, an A/D converter 173, a processor (operation unit) 174, a storage device 175, a communication device 176, and a power supply 177.

Each of the first sensors 104A to 104C is connected to the circuit board 106 through a corresponding wiring group among the wiring groups 108A to 108C. Further, each of the first sensors 104A to 104C is connected to a corresponding one among the C/V conversion circuits 172A to 172C through some wirings included in the corresponding wiring group. Each of the second sensors 105A to 105C is connected to the circuit board 106 through a corresponding wiring group among the wiring groups 208A to 208C. Further, each of the second sensors 105A to 105C is connected to a corresponding one among the C/V conversion circuits 272A to 272C through some wirings included in the corresponding wiring group.

The following is description on a single first sensor 104 having the same configuration as that of each of the first sensors 104A to 104C, a single wiring group 108 having the same configuration as that of each of the wiring groups 108A to 108C, a single C/V conversion circuit 172 having the same configuration as that of each of the C/V conversion circuits 172A to 172C, a single second sensor 105 having the same configuration as that of each of the second sensors 105A to 105C, a single wiring group 208 having the same configuration as that of each of the wiring groups 208A to 208C, and a single C/V conversion circuit 272 having the same configuration as that of each of the C/V conversion circuits 272A to 272C.

The wiring group 108 includes wirings 181 to 183. One end of the wiring 181 is connected to the pad 151 connected to the electrode 141. The wiring 181 is connected to a ground potential line GL connected to a ground GC of the circuit board 106. The wiring 181 may be connected to the ground potential line GL via a switch SWG. One end of wiring 182 is connected to the pad 152 connected to the guard electrode 142, and the other end of the wiring 182 is connected to the C/V conversion circuit 172. One end of the wiring 183 is connected to the pad 153 connected to the sensor electrode 143, and the other end of the wiring 183 is connected to the C/V conversion circuit 172.

The wiring group 208 includes wirings 281 to 283. One end of the wiring 281 is connected to the electrode 163. The wiring 281 is connected to the ground potential line GL connected to the ground GC of the circuit board 106. The wiring 281 may be connected to the ground potential line GL via the switch SWG. One end of the wiring 282 is connected to the guard electrode 162, and the other end of the wiring 282 is connected to the C/V conversion circuit 272. One end of the wiring 283 is connected to the sensor electrode 161, and the other end of the wiring 283 is connected to the C/V conversion circuit 272.

The high frequency oscillator 171 is connected to the power supply 177 such as a battery. The high frequency oscillator 171 is configured to receive power from the power supply 177 and generate a high frequency signal. The power supply 177 is also connected to the processor 174, the storage device 175, and the communication device 176. The high frequency oscillator 171 has a plurality of output lines. The high frequency oscillator 171 is configured to apply the generated high frequency signal to the wirings 182, 183, 282 and 283 through the output lines. Therefore, the high frequency oscillator 171 is electrically connected to the guard electrode 142 and the sensor electrode 143 of the first sensor 104, and the high frequency signal from the high frequency oscillator 171 is applied to the guard electrode 142 and the sensor electrode 143. Further, the high frequency oscillator 171 is electrically connected to the sensor electrode 161 and the guard electrode 162 of the second sensor 105, and the high frequency signal from the high frequency oscillator 171 is applied to the sensor electrode 161 and the guard electrode 162.

The wirings 182 and 183 are connected to an input of the C/V conversion circuit 172. In other words, the guard electrode 142 and the sensor electrode 143 of the first sensor 104 are connected to the input of the C/V conversion circuit 172. The sensor electrode 161 and the guard electrode 162 are connected to an input of the C/V conversion circuit 272. The C/V conversion circuits 172 and 272 are configured to generate a voltage signal having an amplitude corresponding to the potential difference at the input thereof and output the corresponding voltage signal. As the electrostatic capacitance of the sensor electrode connected to the C/V conversion circuit 172 is increased, the magnitude of the voltage signal outputted from the C/V conversion circuit 172 is increased. Similarly, as the electrostatic capacitance of the sensor electrode connected to the C/V conversion circuit 272 is increased, the magnitude of the voltage signal outputted from the C/V conversion circuit 272 is increased.

Figure 11:
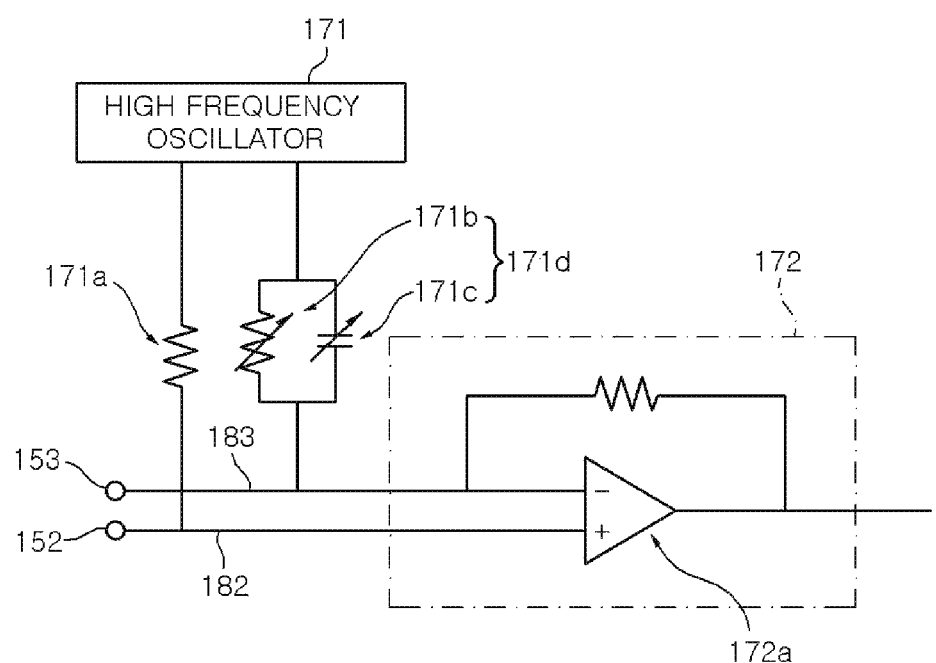
FIG. 11 shows details of the configuration of the circuit board of the measuring device.

Hereinafter, the connection of the high frequency oscillator 171, the wirings 182 and 183 and the C/V conversion circuit 172 will be described in detail. FIG. 11 is a circuit diagram showing the connection of the high frequency oscillator 171, the wirings 182 and 183, and the C/V conversion circuit 172. As shown in FIG. 11, a resistor 171a is connected between the high frequency oscillator 171 and the wiring 182. A variable impedance circuit 171d including a variable resistor 171b and a variable capacitor 171c is connected between the high frequency oscillator 171 and the wiring 183. The C/V conversion circuit 172 includes an amplifier circuit 172a having an operational amplifier and a resistor. In the amplifier circuit 172a, the wiring 183 is inputted to an inverting input of the operational amplifier, and the wiring 182 is inputted to a non-inverting input of the operational amplifier. The inverting input and the output of the operational amplifier are connected through a resistor. The amplifier circuit 172a amplifies a potential difference between the signal from the sensor electrode 143 and the signal from the guard electrode 142 which are inputted to the C/V conversion circuit 172.

The high frequency oscillator 171, the wirings 282 and 283 and the C/V conversion circuit 272 are connected in the same manner as in the high frequency oscillator 171, the wirings 182 and 183 and the C/V conversion circuit 172. In other words, a resistor is connected between the high frequency oscillator 171 and the wiring 282. A variable impedance circuit including a variable resistor and a variable capacitor is connected between the high frequency oscillator 171 and the wiring 283. The C/V conversion circuit 272 includes an amplifier circuit having an operational amplifier and a resistor. In the amplifier circuit, the wiring 283 is inputted to an inverting input of the operational amplifier, and the wiring 282 is inputted to a non-inverting input of the operational amplifier. The inverting input and the output of the operational amplifier are connected through a resistor.

The outputs of the C/V conversion circuits 172 and 272 are connected to the input of the A/D converter 173. The A/D converter 173 is connected to the processor 174. The A/D converter 173 is controlled by a control signal from the processor 174. The A/D converter 173 converts the output signals (voltage signals) of the C/V conversion circuits 172 and 272 to digital values and outputs the digital values as detection values to the processor 174.

The storage device 175 is connected to the processor 174. The storage device 175 may be a volatile memory and is configured to store measurement data to be described later. Another storage device 178 is also connected to the processor 174. The storage device 178 may be a nonvolatile memory and is configured to store a program that is read out and executed by the processor 174.

The communication device 176 conforms to any wireless communication standard. For example, the communication device 176 conforms to Bluetooth (registered trademark). The communication device 176 is configured to wirelessly transmit the measurement data stored in the storage device 175.

The processor 174 is configured to control the respective components of the measuring device 100 by executing the above-described program. For example, the processor 174 is configured to control the supply of the high frequency signal from the high frequency oscillator 171 to the guard electrode 142, the sensor electrodes 143 and 161, and the guard electrode 162, the supply or power from the power supply 177 to the storage device 175, the supply of power from the power supply 177 to the communication device 176, and the like. Further, the processor 174 executes the above-described program and acquires the measurement values of the first sensor 104 and the second sensor 105 based on the detection values inputted from the A/D converter 173. In one embodiment, when the detection value outputted from the A/D converter 173 is set to X, the processor 174 acquires the measurement value based on the detection value such that the measurement value becomes proportional to $(a \cdot X + b)$. Here, "a" and "b" are constants that change depending on a circuit state or the like. For example, the processor 174 may have a predetermined calculation equation (function) in which the measurement value becomes proportional to $(a \cdot X + b)$.

In the measuring device 100 described above, the sensor electrodes 143 and the guard electrodes 142 face the inner periphery of the focus ring FR in a state where the measuring device 100 is disposed in a region surrounded by the focus ring FR. The measurement value generated based on the potential difference between the signal of the sensor electrode 143 and the signal of the guard electrode 142 indicates the electrostatic capacitance reflecting the distance between each of the sensor electrodes 143 and the focus ring. The electrostatic capacitance C is represented by $C=\varepsilon S/d$. "$\varepsilon$" represents a dielectric constant of a medium between the front surface 143$f$ of the sensor electrode 143 and the inner periphery of the focus ring FR; "S" represents an area of the front surface 143$f$ of the sensor electrode 143; and "d" represents a distance between the front surface 143$f$ of the sensor electrode 143 and the inner periphery of the focus ring FR. Therefore, in accordance with the measuring device 100, the measurement data reflecting the relative positional relation between the focus ring FR and the measuring device 100 that imitates the target object W, is obtained. For example, the plurality of measurement values obtained by the measuring device 100 is decreased as the distance between the front surface 143$f$ of the sensor electrode 143 and the inner periphery of the focus ring FR is increased.

In a state where the measuring device 100 is mounted on the electrostatic chuck ESC, the sensor electrodes 161 face the electrostatic chuck ESC. When the sensor electrode 161 is deviated radially outward with respect to the electrostatic chuck ESC, the electrostatic capacitance measured by the sensor electrode 161 becomes smaller than that measured at the time of transferring the measuring device 100 to a predetermined transfer position. When the sensor electrode 161 is radially deviated inward with respect to the electrostatic chuck ESC, the electrostatic capacitance measured by the sensor electrode 161 becomes greater than that measured at the time of transferring the measuring device 100 to the predetermined transport position. Therefore, the deviation amount of each of the sensor electrodes 161 in the radial direction of the electrostatic chuck ESC can be obtained by referring to the data table using measurement values representing the electrostatic capacitances of the sensor electrodes 161 of the second sensors 105A to 105C. An error of the transfer position of the measuring device 100 can be obtained from the deviation amount of each of the sensor electrodes 161 of the second sensors 105A to 105C in the radial direction.

Figure 12:
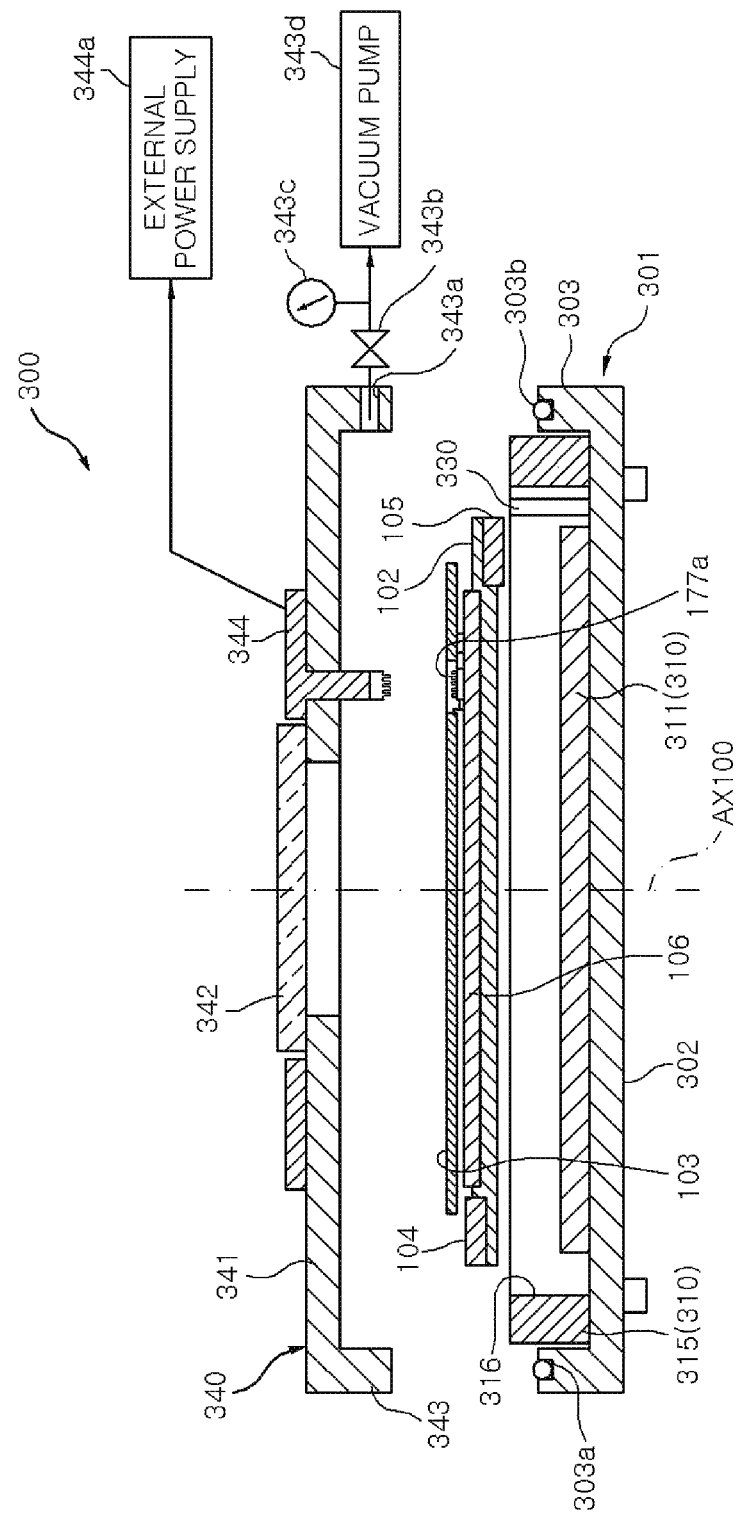
FIG. 12 is a cross sectional view showing an example of a disassembled case.

Next, a case used for calibrating the measuring device 100 will be described. FIG. 12 is a cross sectional view showing a case disassembled into a lid and a case main body. A case 300 includes a case main body 301, a reference sample 310, restricting portions 330, and a lid 340. The case main body 301 is configured to accommodate the measuring device 100 therein. In one embodiment, the case main body 301 includes a bottom portion 302 on which the measuring device 100 is provided, and a peripheral wall 303 surrounding the periphery of the bottom portion 302. As in the case of the measuring device 100, the bottom portion 302 may have a circular shape when seen from the top. The bottom portion 302 may have a polygonal shape, e.g., an octagonal shape, when seen from the top. A groove 303$a$ surrounding the bottom portion 302 along the peripheral wall 303 is formed at an upper end of the peripheral wall 303. An O-ring 303$b$ is provided in the groove 303$a$.

The reference sample 310 has a bottom plate 311 and a side plate 315. The bottom plate 311 has a flat plate shape and is mounted on the top surface of the bottom portion 302. The side plate 315 has a substantially annular shape and is disposed to surround the periphery of the bottom plate 311. In the case main body 301, the measuring device 100 is provided at an inner side of the side plate 315 and on the top surface of the bottom plate 311. In a state where the measuring device 100 is mounted on the bottom plate 311, the sensor electrode 161 can face a part of the top surface of the bottom plate 311. Further, in a state where the measuring device 100 is mounted on the bottom plate 311, the sensor electrode 143 can face a part of the inner peripheral surface of the side plate 315. The bottom plate 311 and the side plate 315 may be made of a metal such as aluminum or the like.

Figure 13:
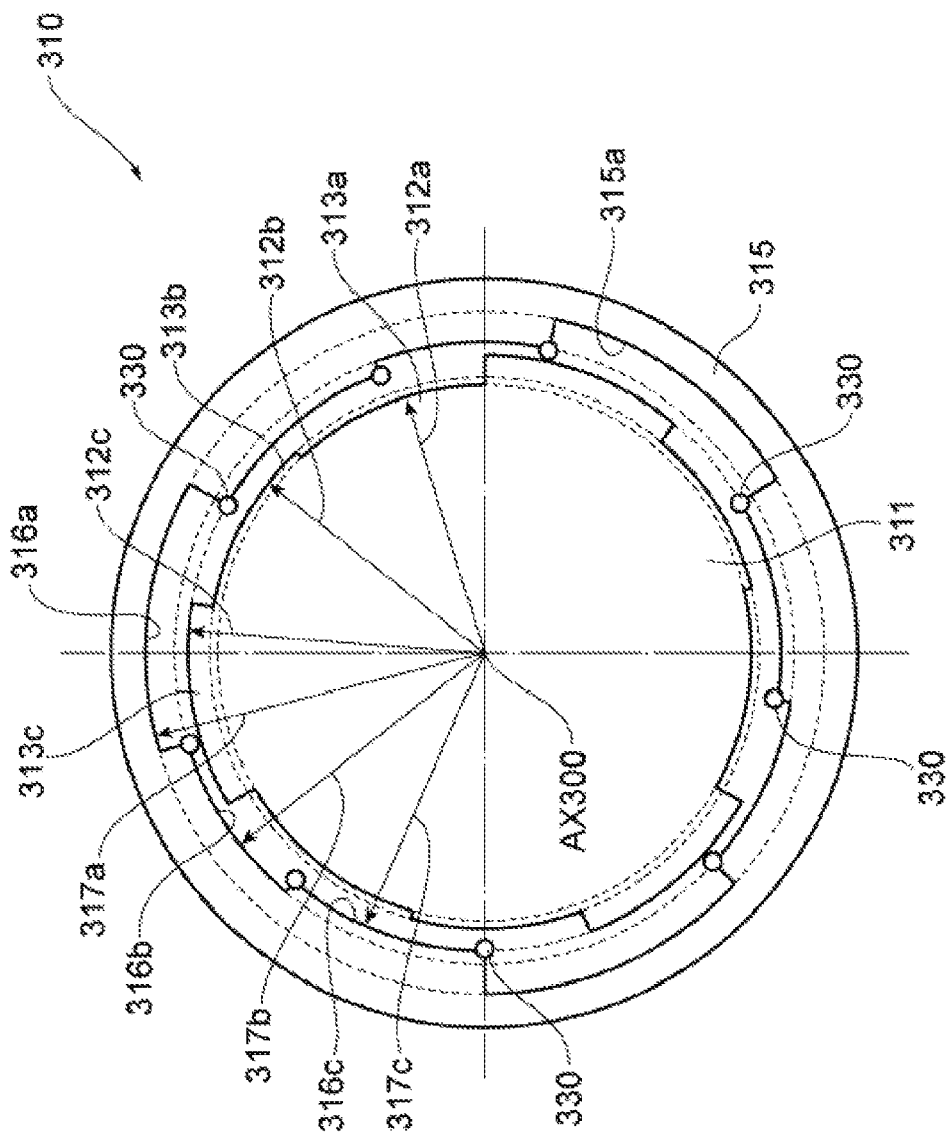
FIG. 13 is a top view schematically showing a configuration of the case.

FIG. 13 is a top view specifically showing the reference sample 310. The bottom plate 311 has a substantially disk shape. A distance between the central axis AX300 of the region of the bottom plate 311 where the measuring device 100 is disposed and the outer edge of the bottom plate 311 varies at a predetermined interval in the circumferential direction. In a state where the measuring device 100 is provided, the central axis AX100 of the measuring device 100 coincides with the central axis AX300 of the bottom plate 311. Hereinafter, for convenience, the distance between the central axis AX300 and the outer edge of the bottom plate 311 will be referred to as "radius" of the bottom plate 311. In one embodiment, the area where three sensor electrodes 161 and the bottom plate 311 are overlapped with each other in the direction of the central axis AX300 can have three different sizes. For example, in the bottom plate 311, a portion having a predetermined radius and a portion having a radius different from the predetermined radius may be alternately arranged. The radius of the bottom plate 311 in the illustrated example varies at an interval of 40°. More specifically, a portion having a first radius 312$a$, a portion having a second radius 312$b$, and a portion having a third radius 312$c$ are sequentially arranged in a counterclockwise direction along the circumferential direction.

In one example, the first radius 312$a$ is smaller than the radius of the measuring device 100. For example, the first radius 312$a$ is smaller than the distance between the central axis AX100 and the circular arc 161$a$ of the sensor electrode 161. In other words, in the bottom plate 311, an upper surface 313$a$ of the portion having the first radius 312$a$ cannot face the sensor electrode 161 in a state where the measuring device 100 is mounted on the bottom plate 311. Even when the positions of the upper surface 313$a$ and the sensor electrode 161 in the circumferential direction coincide with each other, the output signal (voltage signal) of the C/V conversion circuit 272 corresponding to the signal of the sensor electrode 161 ideally becomes zero. The second radius 312$b$ is equal to the radius of the measuring device 100. In the bottom plate 311, a portion having the second radius 312$b$ has an upper surface (first reference surface) 313$b$ that can face the sensor electrode 161 in a state where the measuring device 100 is mounted on the bottom plate 311. The third radius 312$c$ is greater than the radius of the measuring device 100. In the bottom plate 311, the portion having the third radius 312$c$ has an upper surface (second reference surface) 313$c$ that can face the sensor electrode 161 in a state where the measuring device 100 is mounted on the bottom plate 311.

The side plate 315 has a substantially annular shape. The distance between the central axis AX300 and an inner peripheral surface 316 of the side plate 315 varies at a predetermined interval in the circumferential direction. Hereinafter, for convenience, the distance between the central axis and the inner peripheral surface will be referred to as "radius" of the side plate 315. In one embodiment, the distance between the three sensor electrodes 143 and the inner peripheral surface 316 can be varied to three levels. For example, in the side plate 315, a portion having a predetermined radius and a portion having a radius different from the predetermined radius may be alternately arranged.

The radius of the side plate 315 in the illustrated example varies at an interval of 40°. More specifically, a portion having a first radius 317a, a portion having a second radius 317b, and a portion having a third radius 317c are arranged in that order in a counterclockwise direction along the circumferential direction. The first radius 317a is greater than the second radius 317b. The second radius 317b is greater than the third radius 317c.

In the side plate 315, an inner peripheral surface 316a of the portion having the first radius 317a can face the sensor electrode 143 in a state where the measuring device 100 is mounted on the bottom plate 311. Since, however, the distance between the inner peripheral surface 316a and the sensor electrode 143 is large, the output signal of the C/V conversion circuit 172 corresponding to the signal of the sensor electrode 143 ideally becomes zero. In the side plate 315, the portion having the second radius 317b has an inner peripheral surface (first reference surface) 316b that can face the sensor electrode 143 in a state where the measuring device 100 is mounted on the bottom plate 311. In the side plate 315, the portion having the third radius 317c has an inner peripheral surface (second reference surface) 316c that can face the sensor electrode 143 in a state where the measuring device 100 is mounted on the bottom plate 311.

In one example, the radius of the measuring device 100 is 150.0 mm. In the bottom plate 311, the first radius 312a is 148.0 mm; the second radius 312b is 150.0 mm; and the third radius 312c is 150.5 mm. In the side plate 315, the first radius 317a is 154.0 mm; the second radius 317b is 151.0 mm; and the third radius 317c is 150.0 mm.

The deviation between the positions of the upper surfaces 313a to 313c and the positions of the inner peripheral surfaces 316a to 316c in the circumferential direction is the same as the deviation between the positions of the sensor electrodes 161 and the positions of the sensor electrodes 143 in the circumferential direction. In one embodiment, the central position in the circumferential direction of the upper surface 313a is deviated by 60° from the central position in the circumferential direction of the inner peripheral surface 316a. The central position in the circumferential direction of the upper surface 313b is deviated by 60° from the central position in the circumferential direction of the inner peripheral surface 316b. The central position in the circumferential direction of the upper surface 313c is deviated by 60° from the central position in the circumferential direction of the inner peripheral surface 316c.

The restricting portions 330 restrict translation of the measuring device 100 accommodated in the case main body 301. The measuring device 100 can rotate even when the translation is restricted by the restricting portions 330. In one embodiment, the restricting portions 330 are provided on a circumference about the central axis AX300 on the bottom portion 302. The distance between the central axis AX300 and the plurality of restricting portions 330 is equal to the radius of the measuring device 100. In one example, each of the restricting portions 330 has a pin to be brought into direct contact with the edge of the measuring device 100. The restricting portions 330 are provided between the bottom plate 311 and the side plate 315. In the circumferential direction, the restricting portions 330 are provided at positions where the radius of the side plate 315 is changed. For example, three to nine restricting portions 330 may be provided. The illustrated example shows nine restricting portions 330. For example, when only three restricting portions 330 are provided, the restricting portions 330 may be provided at the boundary between the inner peripheral surface 316b and the inner peripheral surface 316c.

The lid 340 can seal an inner space of the case 300 by covering an opening of the case main body 301. The lid 340 has a ceiling portion 341 having the same outer shape as that of the bottom portion 302 when seen from the top and a peripheral wall 343 surrounding the periphery of the ceiling portion 341. In a state where the peripheral wall 343 and the peripheral wall 303 are brought into contact with each other, the case 300 can be hermetically sealed by the action of the O-ring 303b. A window 342 is provided at the center of the ceiling portion 341. The window 342 is made of a transparent material such as glass or the like. In other words, a user can visually check a state in the sealed case 300 through the window 342. A power supply connector 344 is provided at the ceiling portion 341. The power supply connector 344 penetrates through the ceiling portion 341. The power supply connector 344 may be connected to an external power supply 344a at the outside of the case 300. Further, the power supply connector 344 may be connected to a power supply connector (power supply terminal) 177a of the measuring device 100 through the opening 103a in the case 300. The power supply connector 177a is connected to the power supply 177 of the circuit board 106, for example. A gas exhaust port 343a is formed at the peripheral wall 343. The gas exhaust port 343a communicates with the inner space of the case 300. The gas exhaust port 343a may be connected to a vacuum pump 343d through a valve 343b and a pressure gauge 343c.

Figure 14:
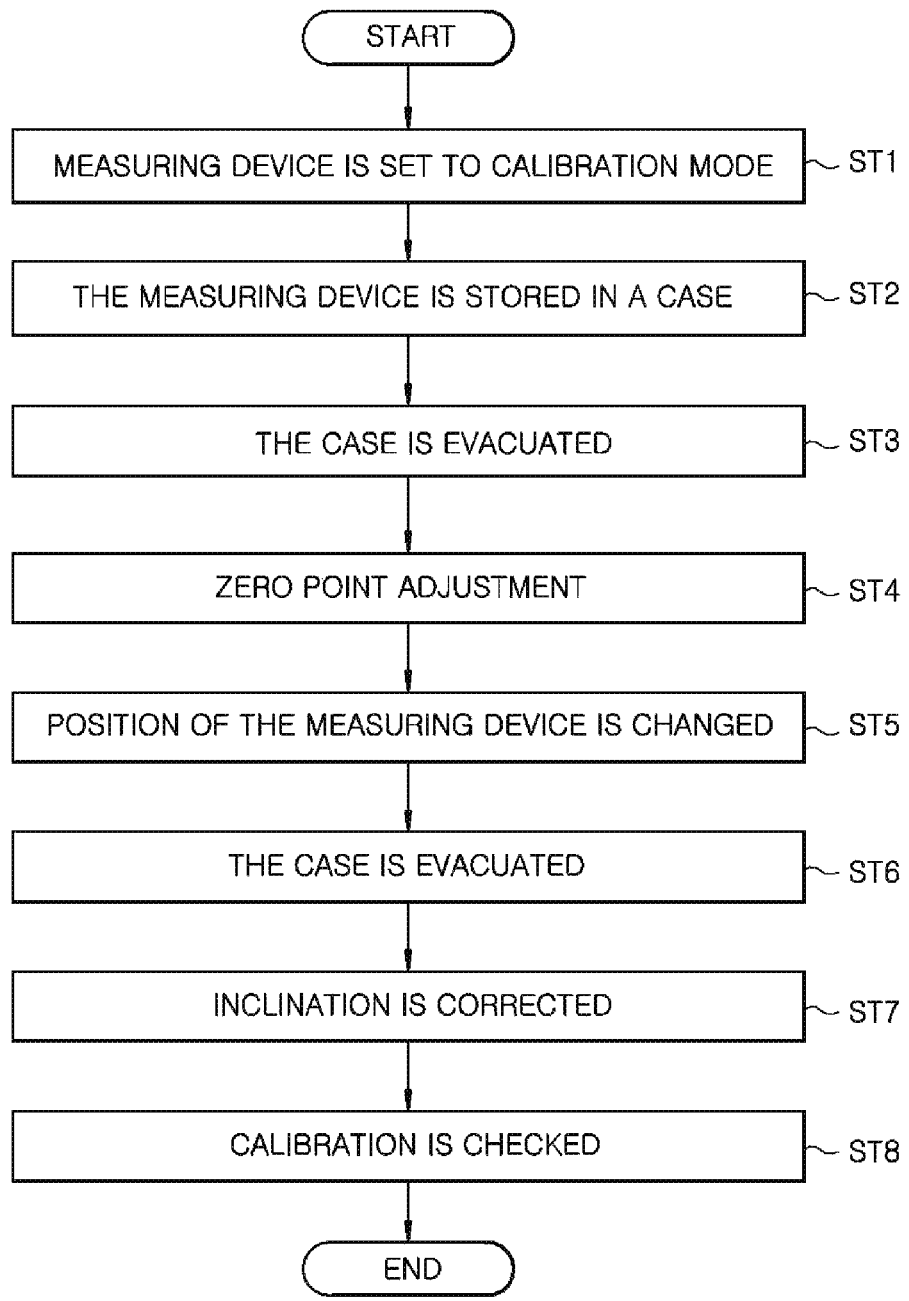
FIG. 14 is a flowchart showing an example of a method for calibrating the measuring device.
Figure 15A:
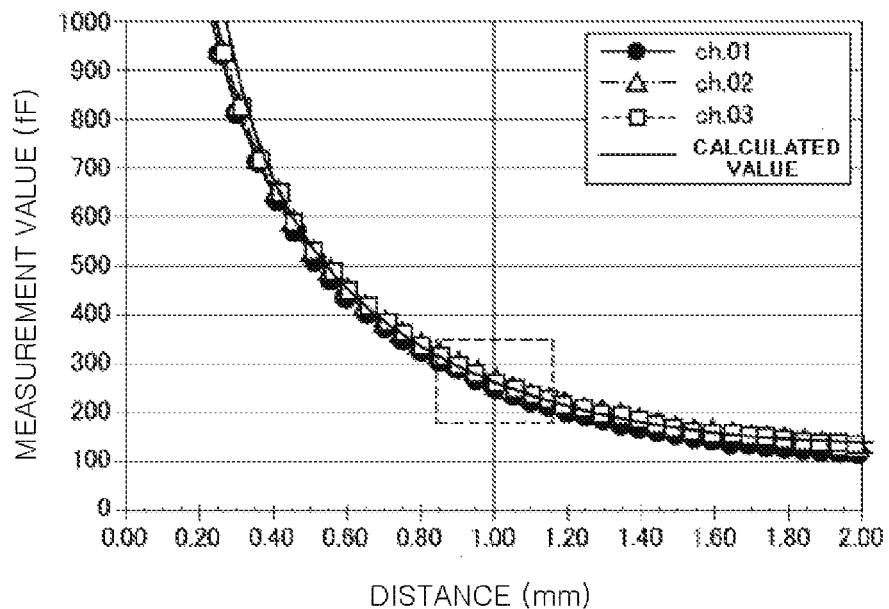
FIGS. 15A, 15B, 16A and 16B are graphs for explaining the calibration method.
Figure 15B:
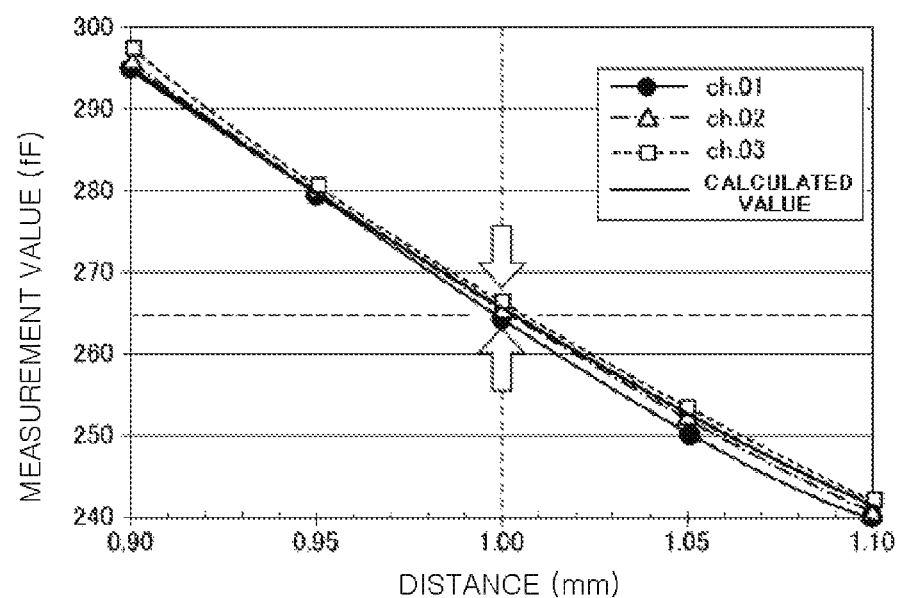
Figure 16A:
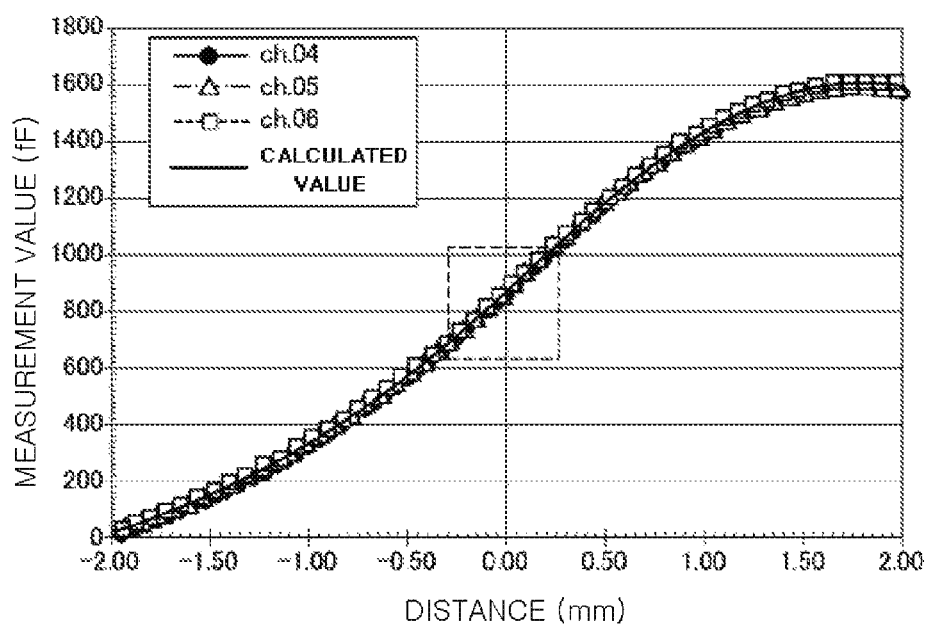
Figure 16B:
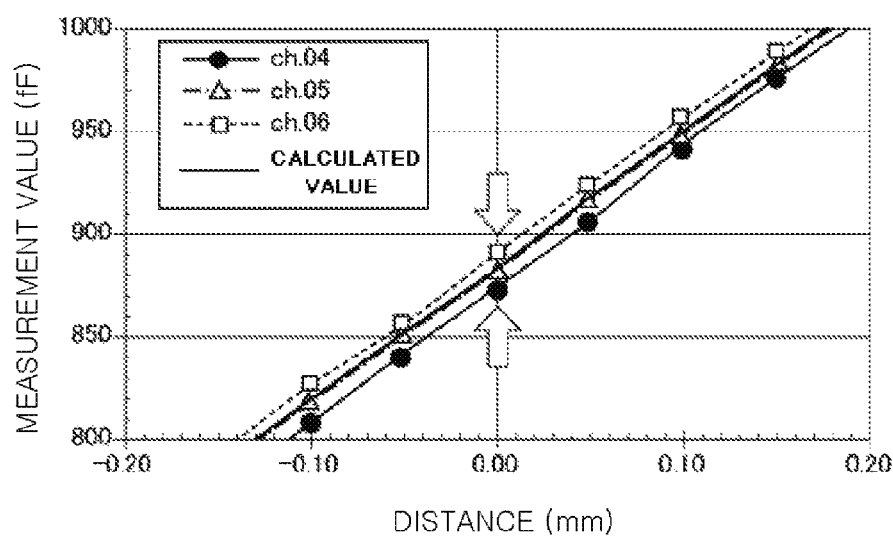

Next, the method for calibrating the measuring device using the case 300 will be described. FIG. 14 is a flowchart for explaining the calibration method. FIGS. 15A and 15B are graphs for explaining the calibration method of the first sensor. FIGS. 16A and 16B are graphs for explaining the calibration method of the second sensor. FIG. 15A shows measurement values of the first sensor 104 which are obtained while varying the distance between the sensor electrode 143 and the inner peripheral surface of the side plate 315. FIG. 15B is a partially enlarged graph of FIG. 15A. In FIGS. 15A and 15B, "ch.01", "ch.02" and "ch.03" represent the measurement values of the first sensors 104A to 104C, respectively. The electrostatic capacitance of the first sensor which is obtained by calculation is expressed as "calculated value". In a state where the first sensor 104 faces the inner peripheral surface 316a, i.e., in a state where the distance therebetween is 4 mm, the electrostatic capacitance may be ideally zero.

FIG. 16A shows measurement values of the second sensor 105 which are obtained by varying the distance between the edge of the measuring device 100 and the edge of the bottom plate 311. FIG. 16B is a partially enlarged graph of FIG. 16A. In FIGS. 16A and 16B, "ch.04", "ch.05" and "ch.06" represent the measurement values of the second sensors 105A to 105C, respectively. The electrostatic capacitance of the second sensor which is obtained by calculation is expressed as "calculated value". The distance between the edge of the measuring device 100 and the edge of the bottom plate 311 is set to zero when the edge of the measuring device 100 coincides with the edge of the bottom plate 311. The distance becomes positive when the edge of the measuring device 100 is positioned inward of the edge of the bottom plate 311 and becomes negative when the edge of the measuring device 100 is positioned outward of the edge of the bottom plate 311. In other words, as the distance becomes greater toward the negative side, the facing area between the sensor electrode 161 and the bottom plate 311 becomes smaller. The state in which the distance is −2 mm indicates the state in which the second sensor 105 is positioned on the upper surface 313a in the circumferential direction and the sensor electrode 161 and the bottom plate 311 are not overlapped with each other in the direction of the central axis AX300.

As shown in FIG. 14, in the method for calibrating the measuring device 100, first, the measuring device 100 is set to a calibration mode (step ST1). In addition to the calibration mode for calibrating the first sensor 104 and the second sensor 105, the measuring device 100 may have a measuring mode for measuring an error in the transfer position of the measuring device 100, or the like.

Next, the measuring device 100 is accommodated in the case 300 (step ST2). In the step ST2, each of the first sensors 104A to 104C is disposed to face the inner peripheral surface. In that state, each of the second sensors 105A to 105C coincides with the position of the upper surface 313a in the circumferential direction. In other words, the sensor electrode 161 and the bottom plate 311 do not face each other.

Then, the case 300 is evacuated (step ST3). In the step ST3, the case 300 is hermetically sealed by the lid 340. Thereafter, the case 300 is evacuated by the vacuum pump through the gas exhaust port.

Next, zero point adjustment is performed (step ST4). In other words, a variable impedance circuit is adjusted such that the potential difference between the signal of the sensor electrode and the signal of the guard electrode which are inputted to the C/V conversion circuit becomes zero. In the step ST2, the measuring device 100 is arranged such that the sensor electrode 143 faces the inner peripheral surface 316a and the sensor electrode 161 faces the upper surface of the bottom portion 302. In that state, the distance between the sensor electrode 143 and the inner peripheral surface 316a is large, and a space which makes the detection value zero is provided in front of the sensor electrode 143. In other words, the voltage signal outputted from the C/V conversion circuit 172 ideally becomes zero. In addition, a space which makes the detection value zero is provided in front of (below) the sensor electrode 161. In other words, the upper surface 313a does not affect the sensor electrode 161 and, thus, the voltage signal outputted from the C/V conversion circuit 272 ideally becomes zero. In step ST4, the processor 174 adjusts the resistance value of the variable resistor 171b and the capacitance of the variable capacitor 171c in the variable impedance circuit 171d such that the voltage signal outputted from the C/V conversion circuit 172 becomes zero. Further, the resistance value of the variable resistor 171b and the capacitance of the variable capacitor 171c in the variable impedance circuit 171d are adjusted such that the voltage signal outputted from the C/V conversion circuit 272 becomes zero.

Next, the position of the measuring device 100 is changed (step ST5). In the step ST5, the measuring device 100 is rotated in a state where the translation of the measuring device 100 is restricted by the restricting portions 330. Accordingly, each of the first sensors 104A to 104C is made to face the inner peripheral surface (first reference surface). In one example, the measuring device 100 is rotated in the counterclockwise direction by 40° when seen from the top. In that state, each of the second sensors 105A to 105C faces the upper surface (the first reference surface). Further, the periphery of the upper surface is aligned with the edge of the measuring device 100.

Then, the case 300 is evacuated (step ST6). Next, the case 300 is evacuated (step ST3). In the step ST 3, the case 300 is hermetically sealed by the lid 340. Thereafter, the case 300 is evacuated by the vacuum pump through the gas exhaust port.

Next, the inclination is corrected (step ST7). In the step ST7, the measuring device 100 is arranged such that the sensor electrode 143 faces the inner peripheral surface and the sensor electrode 161 faces the upper surface. In that state, the distance between the first sensor 104 and the inner peripheral surface is 1 mm. Therefore, the measurement value (first measurement value) of the first sensor 104 is corrected to the electrostatic capacitance (first predetermined value) (see FIGS. 15A and 15B) obtained by calculation when the distance is 1 mm. The distance between the edge of the measuring device 100 (the second sensor 105) and the periphery of the bottom plate 311 is 0 mm. Accordingly, the measurement value (first measurement value) of the second sensor 105 is corrected to the electrostatic capacitance (first predetermined value) (see FIGS. 16A and 16B) obtained by calculation when the distance is 0 mm.

As described above, when the detection value outputted from the A/D converter 173 is set to X, the processor 174 acquires the measurement value such that the measurement value becomes proportional to (a·X+b). As the constant "a" changes, the curvature of the curve indicating the relation between the distance and the measurement value changes in the graphs shown in FIGS. 15A, 15B, 16A and 16B. As the constant "b" changes, the curve indicating the relation between the distance and the measurement value is shifted vertically in the graphs shown in FIGS. 15 and 16. In one embodiment, the constants and "b" are adjusted to correspond to the C/V conversion circuits 172A to 172C and the C/V conversion circuits 272A to 272C such that the detection value X outputted from the A/D converter 173 can be converted to the measurement value of the electrostatic capacitance obtained by calculation.

Next, the calibration result of the measuring device 100 is checked (step ST8). In the step ST8, it is checked whether the acquired electrostatic capacitance is equal to the calculated electrostatic capacitance (second predetermined value) in a state where each of the first sensors 104A to 104C faces the inner peripheral surface 316c and each of the second sensors 105A to 105C faces the upper surface 313c. In other words, in the step ST8, the measuring device 100 is rotated so that each of the first sensors 104A to 104C faces the inner peripheral surface 316c and each of the second sensors 105A to 105C faces the upper surface 313c, and the case 300 is evacuated. In that state, the measurement is performed by the measuring device 100, and the measurement values (second measurement values) acquired by the first sensors 104A to 104C and the second sensors 105A to 105C are checked. When there is no difference between the acquired measurement value and the calculated value, the calibration is terminated. On the contrary, when there is a difference between the acquired measurement value and the calculated value, the constants a and b are calibrated again by using the first measurement value and the second measurement value.

In the above-described calibration method of the measuring device, the translation of the measuring device 100 is restricted by the restricting portions 330 inside the case main body 301 and, thus, it is possible to easily fix the relative positional relation between the sensor electrode 143 and the inner peripheral surface 316b and the relative positional relation between the sensor electrode 161 and the upper surface 313b. When the relative positional relation between the sensor electrode and the reference surface is fixed, the measurement values of the sensor electrodes 143 and 161 are originally constant. Therefore, the measuring device 100 can be easily calibrated by calibrating the coefficient of the function such that the measurement values of the sensor electrodes 143 and 161 become predetermined values in a state where the relative positional relation is fixed.

In a state where the measurement value needs to be zero, the potential difference between the potential of the sensor electrode 143 and the potential of the guard electrode 142 surrounding the sensor electrode 143 is set to zero. Further, in a state where the measurement value needs to be zero, the potential difference between the potential of the sensor electrode 161 and the potential of the guard electrode 162 surrounding the sensor electrode 161 is set to zero. As a result, the calibration can be performed with high accuracy.

The plurality of inner peripheral surfaces 316a to 316 and the plurality of upper surfaces 313a to 313c are arranged in the circumferential direction. Therefore, it is possible to change the reference surface facing the sensor electrode 143 and the sensor electrode 161 only by rotating the measuring device 100 in a plane.

In this method, the coefficient of the function for converting the detection value of the A/D converter into the measurement value is further calibrated in a state where the sensor electrode 161 and the sensor electrode 143 face the upper surface 313c and the inner peripheral surface 316c, respectively, and, thus, the calibration can be performed with higher accuracy.

In one embodiment, the reference surface facing the sensor electrodes 143 and 161 can be easily changed by rotating the measuring device 100 restricted by the restricting portions 330.

Since the case 300 is provided with the gas exhaust port 343a, the measuring device 100 can be calibrated in a state where the case 300 is evacuated.

In one embodiment, the power supply connector 177a and the power supply connector 344 are electrically connected in a state where the measuring device 100 is accommodated in the case main body 301. With this configuration, the power can be supplied to the power supply 177 of the measuring device 100 at the time of calibrating the measuring device 100.

While the embodiments have been described, various modifications can be made without being limited to the above-described embodiments.

For example, a light source such as an LED or the like which notifies a state of the measuring device 100 may be provided on the circuit board 106 to correspond to the position of the opening 103a in the cover 103. In that case, the light source can be visually recognized through the opening 103a and the window 342 and, thus, the user can be informed of the termination of the calibration.

While the present disclosure has been shown and described with respect to the embodiments, it will be understood by those skilled in the art that various changes and modifications may be made without departing from the scope of the present disclosure as defined in the following claims.

What is claimed is:

1. A method for calibrating a measuring device by using a case, wherein the measuring device includes:
   a disk-shaped base substrate;
   a plurality of sensor electrodes provided on the base substrate;
   a high frequency oscillator configured to apply a high frequency signal to the plurality of sensor electrodes; and
   an operation unit configured to calculate a plurality of measurement values indicating electrostatic capacitances of the plurality of sensor electrodes by using a plurality of functions from a plurality of detection values corresponding to potentials of the plurality of sensor electrodes,
   wherein the case includes:
   a case main body configured to accommodate the measuring device;
   a restricting portion configured to restrict translation of the measuring device accommodated in the case main body; and
   a plurality of first reference surfaces provided in the case main body to face the respective sensor electrodes,
   the method comprising:
   acquiring a plurality of first detection values, which is the plurality of detection values, in a state where translation of the measuring device is restricted by the restricting portion, the plurality of first reference surfaces face the respective sensor electrodes and the high frequency signal is applied to the plurality of sensor electrodes; and
   calibrating coefficients in the plurality of functions such that a plurality of first measurement values which is the plurality of measurement values calculated from the plurality of detection values becomes a first predetermined value,
   wherein the plurality of sensor electrodes is provided along a side surface of the base substrate or arranged in a circumferential direction along an edge of a bottom surface of the base substrate.

2. The method of claim 1, wherein the measuring device further includes:
   a plurality of guard electrodes surrounding the respective sensor electrodes; and
   a plurality of variable impedance circuits connected between the plurality of sensor electrodes and the high frequency oscillator,
   wherein the high frequency oscillator is configured to further apply the high frequency signal to the plurality of guard electrodes, and
   each of the plurality of detection values corresponds to a potential difference between a potential of one of the plurality of sensor electrodes and a potential of one of the plurality of guard electrodes which surrounds said one of the sensor electrodes,
   the method further comprising:
   adjusting impedances of the plurality of variable impedance circuits such that the plurality of detection values becomes zero in a state where the high frequency oscillator applies the high frequency signal to the plurality of sensor electrodes and the plurality of guard electrodes and a space which makes the plurality of detection values zero is provided in front of the plurality of sensor electrodes in the case main body.

3. The method of claim 1,
   wherein the plurality of first reference surfaces is arranged in a circumferential direction to face the plurality of sensor electrodes.

4. The method of claim 1, wherein the case further includes a plurality of second reference surfaces different from the plurality of first reference surfaces,
   wherein the plurality of second reference surfaces is provided such that electrostatic capacitances of the plurality of sensor electrodes which are measured when the plurality of second reference surfaces face the respective sensor electrodes become different from electrostatic capacitances of the plurality of sensor electrodes which are measured when the plurality of first reference surfaces face the respective sensor electrodes, the method further comprising:

acquiring a plurality of second detection values, which is the plurality of detection values, in a state where translation of the measuring device is restricted by the restricting portion, and the plurality of second reference surfaces face the plurality of sensor electrodes and the high frequency signal is applied to the plurality of sensor electrodes, wherein in said calibrating the coefficients in the plurality of functions, the coefficients in the plurality of functions are calibrated such that the plurality of first measurement values becomes the first predetermined value and the plurality of second measurement values that is the plurality of measurement values calculated from the plurality of second detection values becomes a second predetermined value.

5. The method of claim 4, wherein the plurality of sensor electrodes is provided along an edge of the base substrate, and the plurality of first reference surfaces and the plurality of second reference surfaces are alternately arranged along the circumferential direction to face the plurality of sensor electrodes.

6. The method of claim 4, wherein the plurality of sensor electrodes is arranged in the circumferential direction along a bottom surface of the base substrate, and the plurality of first reference surfaces is alternately arranged along the circumferential direction to face the plurality of sensor electrodes.

7. The method of claim 1, wherein the case further includes a gas exhaust port connecting the case main body to a gas exhaust unit, the method further comprising:

exhausting the case main body.

8. The method of claim 1, wherein the measuring device further includes a battery and a power supply terminal connected to the battery, the case further includes a connector for power supply, and the power supply terminal and the connector are electrically connected in a state where the measuring device is accommodated in the case main body.

9. The method of claim 1, wherein the first predetermined value is determined according to distances between the plurality of sensor electrodes and the plurality of first reference surfaces, and the plurality of sensor electrodes are the one-to-one correspondence with the plurality of first reference surfaces.

* * * * *